United States Patent
Li et al.

(10) Patent No.: US 12,057,330 B2
(45) Date of Patent: Aug. 6, 2024

(54) MASS TRANSFER EQUIPMENT

(71) Applicant: PlayNitride Display Co., Ltd., MiaoLi County (TW)

(72) Inventors: Yun-Li Li, MiaoLi County (TW); Yu-Hung Lai, MiaoLi County (TW); Tzu-Yang Lin, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 382 days.

(21) Appl. No.: 17/499,881

(22) Filed: Oct. 13, 2021

(65) Prior Publication Data
US 2023/0029828 A1 Feb. 2, 2023

(30) Foreign Application Priority Data
Aug. 2, 2021 (TW) ................................ 110128286

(51) Int. Cl.
*H01L 21/67* (2006.01)
*H01L 25/13* (2006.01)
*H01L 33/00* (2010.01)

(52) U.S. Cl.
CPC ........ *H01L 21/67121* (2013.01); *H01L 25/13* (2013.01); *H01L 33/00* (2013.01)

(58) Field of Classification Search
CPC ......... H01L 21/67121; H01L 21/67132; H01L 25/0753; H01L 25/13; H01L 33/00; H01L 33/005; H01L 33/0095
See application file for complete search history.

(56) References Cited

U.S. PATENT DOCUMENTS 8,721,803 B2 * 5/2014 Nagasaka ........... G03F 7/70925
134/36
2004/0228964 A1 * 11/2004 Ito ......................... H10K 71/135
427/256

(Continued)

FOREIGN PATENT DOCUMENTS

CN 104024835 9/2014
CN 109524512 3/2019

(Continued)

OTHER PUBLICATIONS

"Office Action of Japan Counterpart Application", issued on Oct. 31, 2023, p. 1-p. 2.

(Continued)

*Primary Examiner* — Anh T Vo
(74) *Attorney, Agent, or Firm* — JCIPRNET

(57) ABSTRACT

Mass transfer equipment including a base stage, a first substrate stage, a second substrate stage, at least one laser head and a servo motor module is provided. The first substrate stage is adapted to drive a target substrate to move along a first direction. The second substrate stage is adapted to drive at least one micro device substrate to move along a second direction. The at least one laser head is adapted to move to a target position of the second substrate stage and emits a laser beam toward the at least one micro device substrate. At least one micro device is separated from a substrate of the at least one micro device substrate and connected with the target substrate after the irradiation of the laser beam. The servo motor module is used for driving the first substrate stage, the second substrate stage and the at least one laser head to move.

14 Claims, 21 Drawing Sheets

(56) References Cited

U.S. PATENT DOCUMENTS

2014/0306192 A1 10/2014 Han
2020/0006661 A1 1/2020 Shinokawa et al.
2020/0357779 A1 11/2020 Kwag et al.

FOREIGN PATENT DOCUMENTS

| | | |
|---|---|---|
| JP | 2001035816 | 2/2001 |
| JP | 2012192427 | 10/2012 |
| JP | 2019522891 | 8/2019 |
| JP | 2020042116 | 3/2020 |
| JP | 2020069530 | 5/2020 |
| KR | 20210040210 | 4/2021 |
| TW | 200400630 | 1/2004 |
| TW | 200415128 | 8/2004 |
| TW | 201822589 | 6/2018 |
| TW | 201909379 | 3/2019 |
| TW | 202008558 | 2/2020 |
| TW | 202036927 | 10/2020 |
| WO | 2020188780 | 9/2020 |

OTHER PUBLICATIONS

"Office Action of Taiwan Counterpart Application", issued on Jun. 23, 2022, p. 1-p. 12.
"Notice of allowance of Taiwan Related Application, Application No. 112127311", issued on Dec. 25, 2023, p. 1-p. 3.
"Office Action of China Counterpart Application", issued on Jan. 10, 2024, p. 1-p. 9.
"Office Action of Korea Counterpart Application", issued on May 17, 2024, with English translation thereof, p. 1-p. 9.

* cited by examiner

MASS TRANSFER EQUIPMENT

CROSS-REFERENCE TO RELATED APPLICATION

This application claims the priority benefit of Taiwan application serial no. 110128286, filed on Aug. 2, 2021. The above-mentioned patent application is hereby incorporated by reference herein and made a part of this specification.

BACKGROUND

Technical Field

The invention relates to process equipment, and particularly relates to mass transfer equipment.

Description of Related Art

In recent years, under situations that manufacturing cost of organic light-emitting diode (OLED) display panels is too high and a service life thereof cannot compete with that of current mainstream displays, micro LED displays gradually attract investment attentions of major technology companies. In addition to advantages of low energy consumption and long material service life, micro LED displays further have excellent optical performance, such as high color saturation, fast response speed and high contrast.

On the other hand, in order to achieve lower production cost and a larger product design margin, a manufacturing technology of the micro LED display adopts a method of die transfer, i.e., a mass transfer technology, which may directly transfer fabricated micro LED dies to a driving circuit backplane. To be specific, a die manufacturer needs to fabricate (or place) the micro LED dies required by a customer on a temporary substrate, and then the customer may transfer the micro LED dies on the temporary substrate to the driving circuit backplanes of different products according to different application requirements.

However, during the process of die production and transfer, a certain number of abnormal dies and poor bonding may inevitably occur. As the size of the display panel increases, a process time of the aforementioned mass transfer technology is bound to increase significantly, and repair of the dies becomes more difficult and time-consuming.

SUMMARY

The invention is directed to mass transfer equipment, which is adapted to simultaneously improve a speed and yield of device repair or device transfer.

The invention provides mass transfer equipment including a base stage, a first substrate stage, a second substrate stage, at least one laser head and a servo motor module. The first substrate stage is disposed on the base stage, and is adapted to drive a target substrate to move relative to the base stage along a first direction. The second substrate stage is disposed on the base stage, and is adapted to drive at least one micro device substrate to move relative to the first substrate stage along a second direction. The first direction intersects the second direction. The at least one micro device substrate has a substrate and at least one micro device. The at least one micro device is disposed on a surface of the substrate facing the target substrate. The at least one laser head is adapted to move to a corresponding target position of the second substrate stage and emits a laser beam toward the at least one micro device substrate. The laser beam is used to irradiate the at least one micro device substrate, so that the at least one micro device is separated from the substrate and connected with the target substrate. The servo motor module is used for driving the first substrate stage, the second substrate stage and the at least one laser head to move.

In an embodiment of the invention, the first substrate stage of the mass transfer equipment is further adapted to drive the target substrate to move relative to the base stage along the second direction. The second substrate stage is further adapted to drive the at least one micro device substrate to move relative to the first substrate stage along the first direction and a third direction, and the third direction intersects the first direction and the second direction.

In an embodiment of the invention, the second substrate stage of the mass transfer equipment moves along the third direction, so that the at least one micro device of the at least one micro device substrate contacts the target substrate.

In an embodiment of the invention, the first substrate stage of the mass transfer equipment is further adapted to rotate along a rotating axis, and an axial direction of the rotating axis is perpendicular to the first direction and second direction.

In an embodiment of the invention, the second substrate stage of the mass transfer equipment has at least one opening, and the at least one micro device substrate is disposed corresponding to the at least one opening. The laser beam is adapted to irradiate the at least one micro device substrate through the at least one opening.

In an embodiment of the invention, the mass transfer equipment further includes at least one light shielding layer disposed in overlap with the at least one micro device substrate. The at least one light shielding layer has at least one light-transmitting area overlapped with the at least one micro device. At least a part of the laser beam further irradiates the at least one micro device substrate through the at least one light-transmitting area.

In an embodiment of the invention, the at least one micro device substrate of the mass transfer equipment is a plurality of micro device substrates. The at least one laser head is a plurality of laser heads, and the laser heads are respectively disposed corresponding to the micro device substrates.

In an embodiment of the invention, the plurality of micro device substrates of the mass transfer equipment respectively have an epitaxial substrate. The at least one micro device is a plurality of micro light-emitting devices respectively formed on each of the epitaxial substrates, and a luminous color of the plurality of micro light-emitting devices of any one of the micro device substrate is different from a luminous color of the plurality of micro light-emitting devices of another one of the micro device substrates.

In an embodiment of the invention, the target substrate of the mass transfer equipment has a plurality of pixel areas, and includes a circuit backplane and at least one reserved bonding layer. The at least one reserved bonding layer is arranged in one of the pixel areas. The at least one micro device of the at least one micro device substrate is a repairing micro light-emitting device, and the repairing micro light-emitting device is arranged in a corresponding arrangement position on the substrate of the at least one micro device substrate according to a position coordinate on the target substrate.

In an embodiment of the invention, the laser head of the mass transfer equipment is moved to the corresponding target position of the second substrate stage according to the arrangement position, and emits the laser beam toward a part of the at least one micro device substrate at the arrangement position, so that the repairing micro light-emitting device is connected with the at least one reserved bonding layer in one of the pixel areas, and is separated from the substrate of the at least one micro device substrate.

In an embodiment of the invention, the at least one micro device substrate of the mass transfer equipment further has a release layer connected between the plurality of micro devices and the substrate, and a viscosity of the release layer becomes invalid after being irradiated by the laser beam.

In an embodiment of the invention, the release layer is a laser debonding layer or a laser dissociation layer.

In an embodiment of the invention, the at least one micro device substrate of the mass transfer equipment further has a dynamic release layer connecting the at least one micro device and the substrate. After the laser beam irradiates the at least one micro device substrate, the dynamic release layer is deformed to separate the at least one micro device.

In an embodiment of the invention, the target substrate of the mass transfer equipment is a combination of a carrier substrate and an adhesive layer, and the at least one micro device is adhered to the carrier substrate through the adhesive layer.

Based on the above description, in the mass transfer equipment of the embodiment of the invention, the first substrate stage and the second substrate stage respectively drive the target substrate and the micro device substrate to move in different directions, which may increase an alignment speed of transfer target regions on the target substrate and the micro devices to be transferred on the micro device substrate. Regarding a transfer process or repairing process where distribution of the transfer target regions is relatively irregular, mobility of the laser head increases selection flexibility of the micro devices to be transferred on the micro device substrate, which helps to reduce a process time and improve a process yield. In addition, configuration of the servo motor module may further increase alignment accuracy between the target substrate, the micro device substrate and the laser head.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
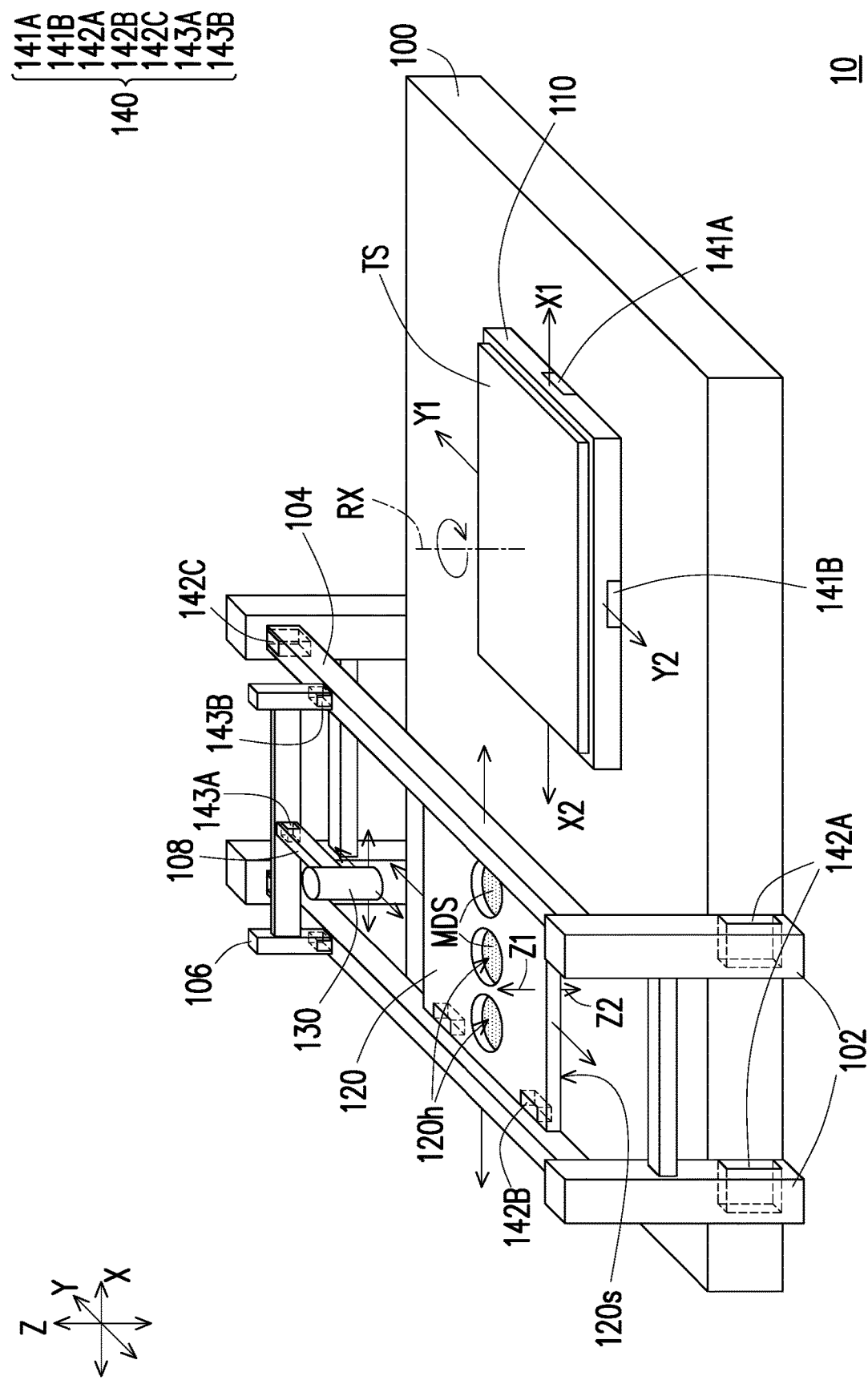
FIG. 1 is a schematic diagram of a mass transfer equipment according to a first embodiment of the invention.

In the drawings, for clarity's sake, a thickness of layers, films, panels, regions, etc., are enlarged. It should be understood that when a component such as a layer, a film, a region, or a substrate is referred to be "on" or "connected to" another component, it may be directly on or connected to the another component, or intermediate components may also exist there between. Comparatively, when a component is referred to be "directly on" or "directly connected" to another, none other intermediate component exits there between. As used herein, the "connection" may refer to physical and/or electrical connection. Furthermore, "electrical connection" of two components may refer to that other components may exist between the two components.

Reference will now be made in detail to the present preferred embodiments of the invention, examples of which are illustrated in the accompanying drawings. Wherever possible, the same reference numbers are used in the drawings and the description to refer to the same or like parts.

Figure 2:
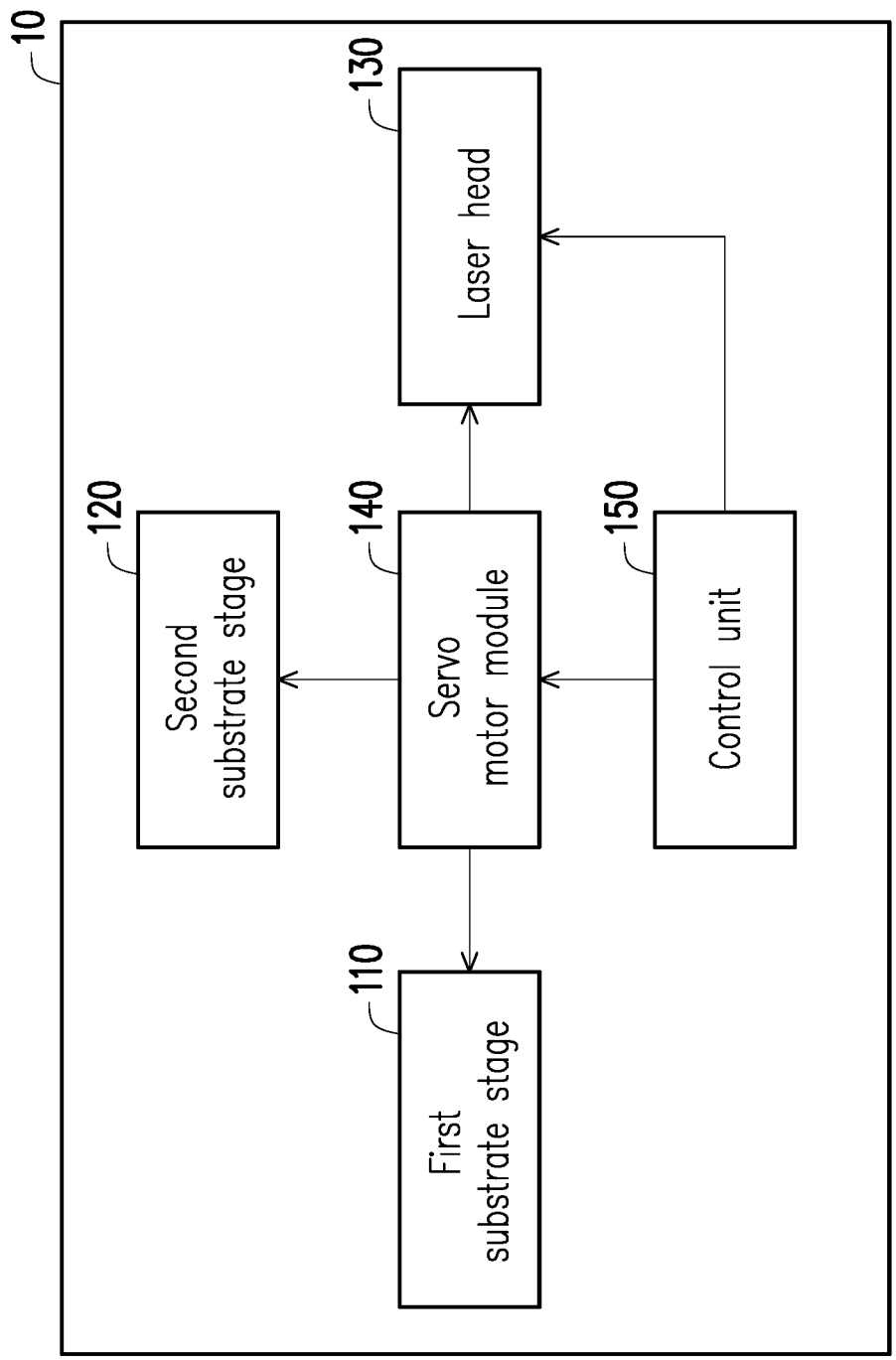
FIG. 2 is a block diagram of the mass transfer equipment of FIG. 1.
Figure 3A:
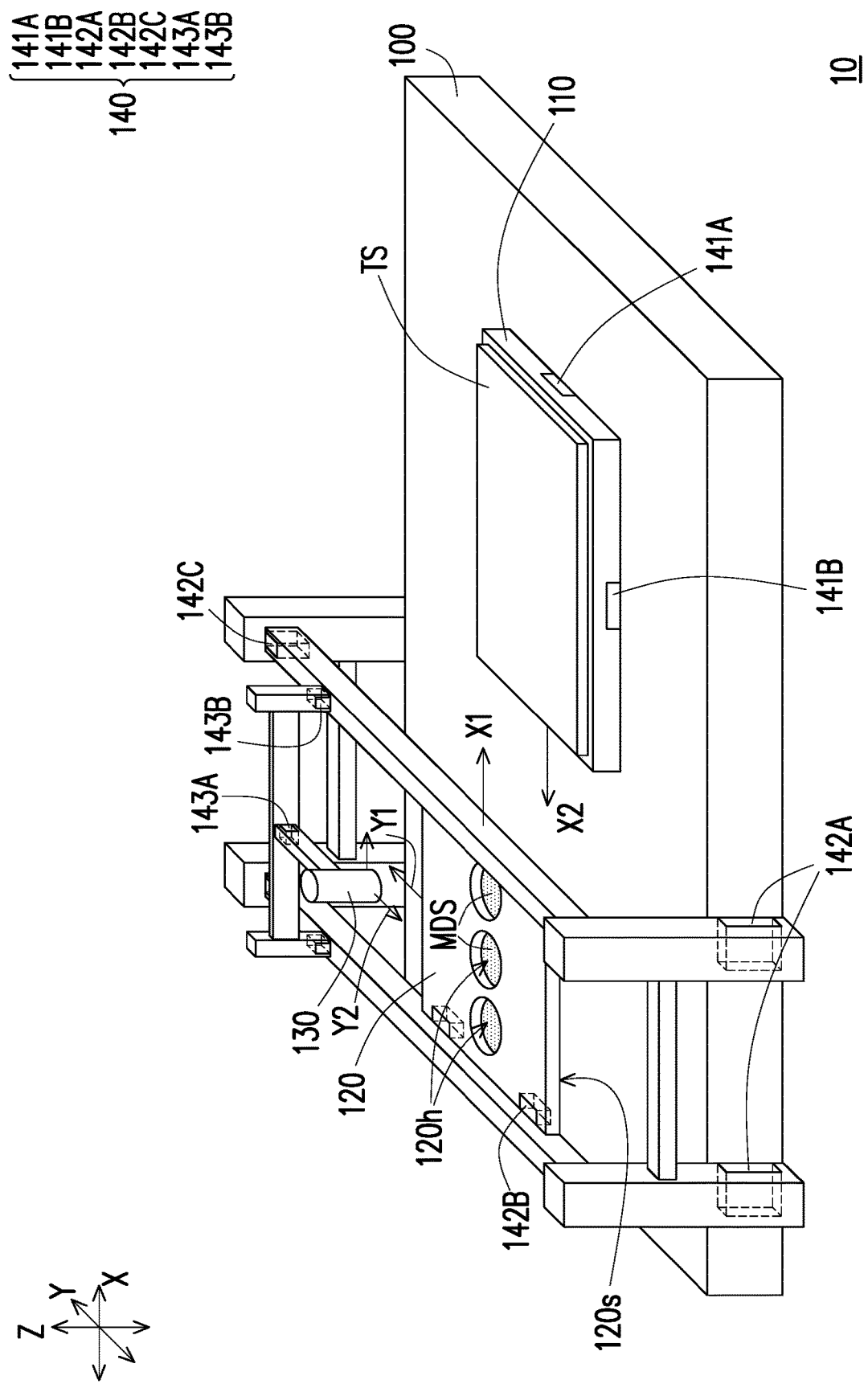
FIG. 3A to FIG. 3D are schematic diagrams of a process of transferring micro devices by using the mass transfer equipment of FIG. 1.
Figure 4A:
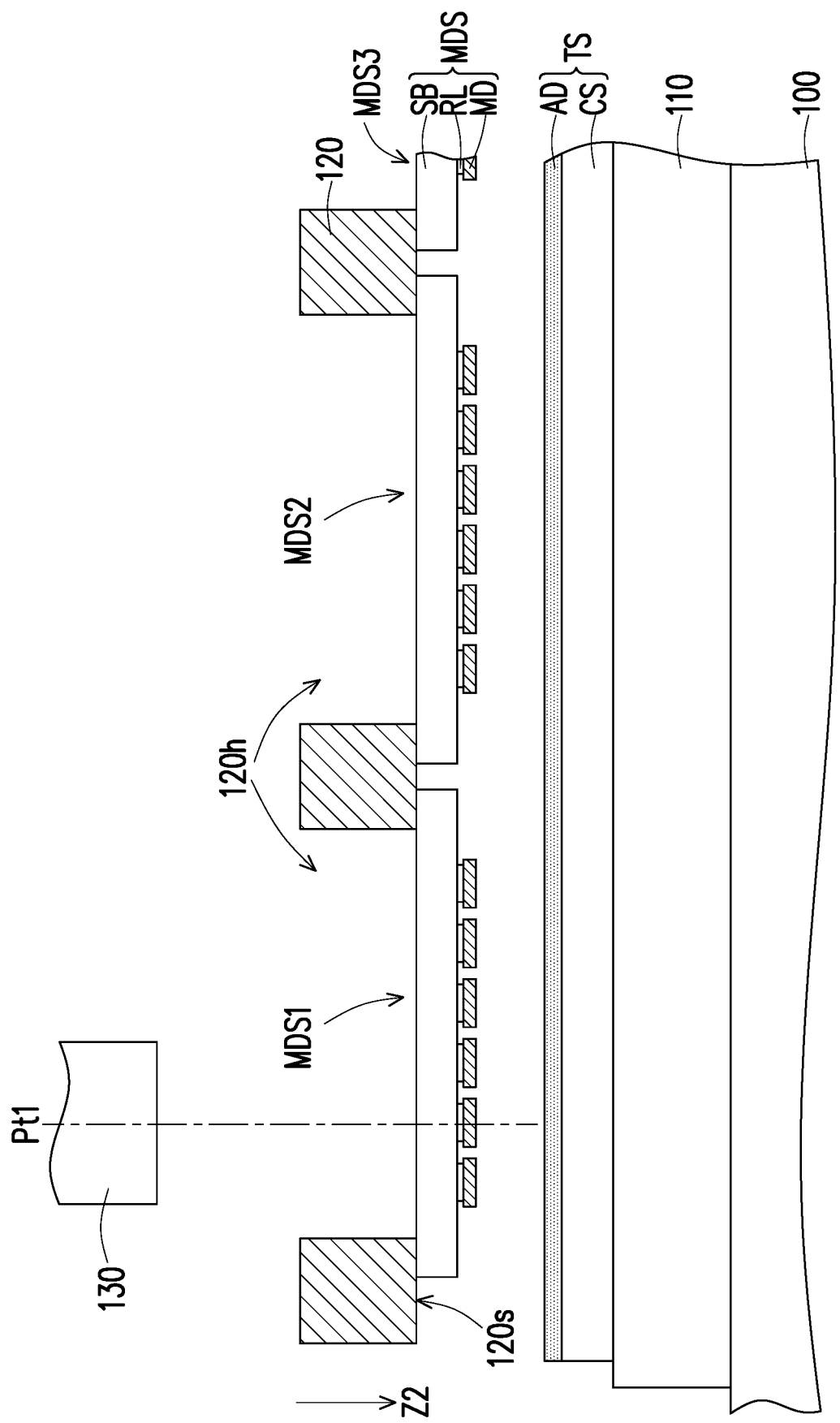
FIG. 4A to FIG. 4D are cross-sectional views of the process of transferring micro devices by using the mass transfer device of FIG. 1.
Figure 6A:
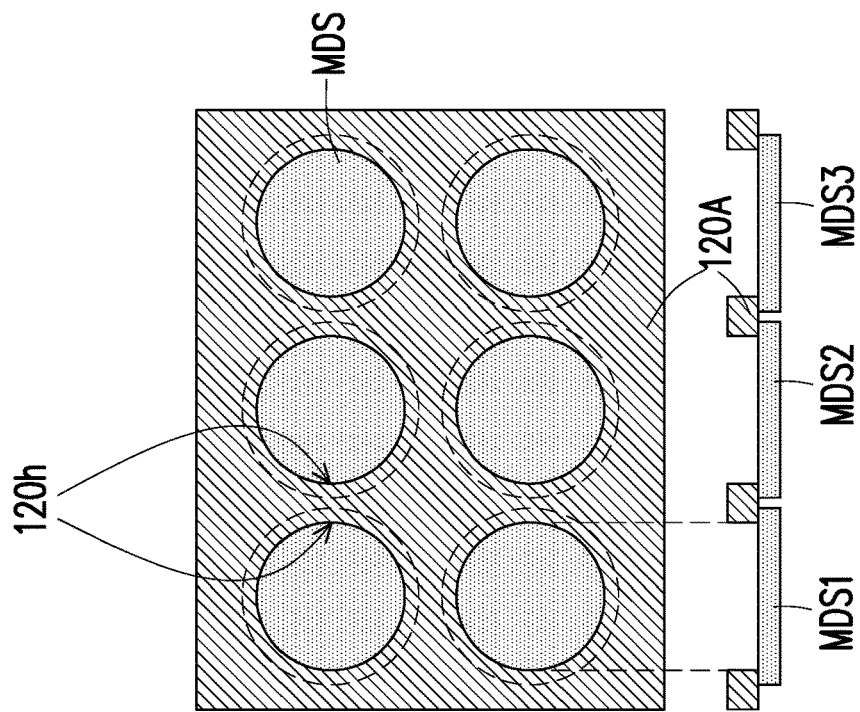
FIG. 6A and FIG. 6B are schematic diagrams of the second substrate stage and the micro device substrate under different viewing angles according to some other modified embodiments of FIG. 5.
Figure 5:
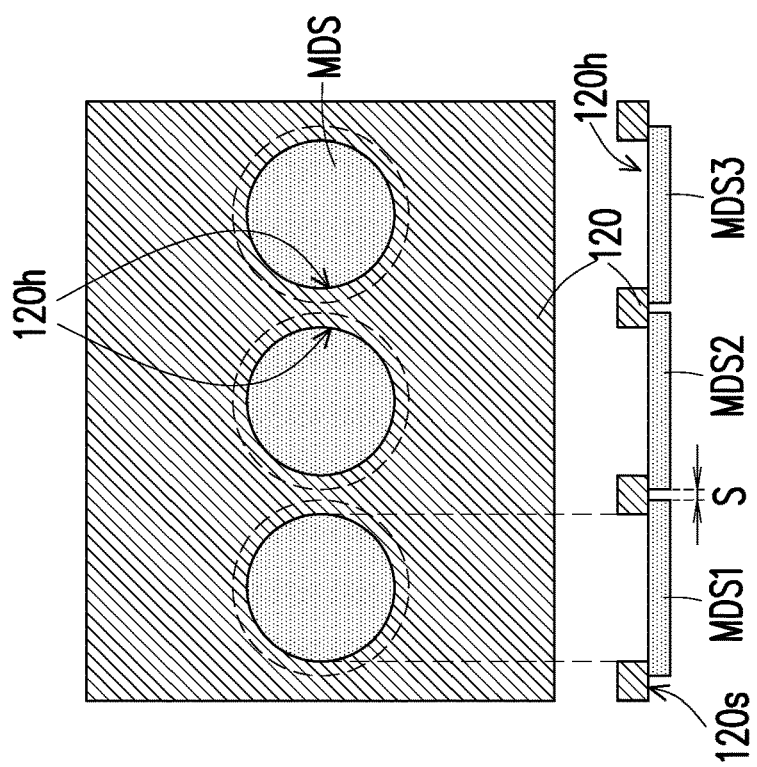
FIG. 5 is a schematic diagram of a second substrate stage and a micro device substrate of FIG. 1 under different viewing angles.
Figure 6B:
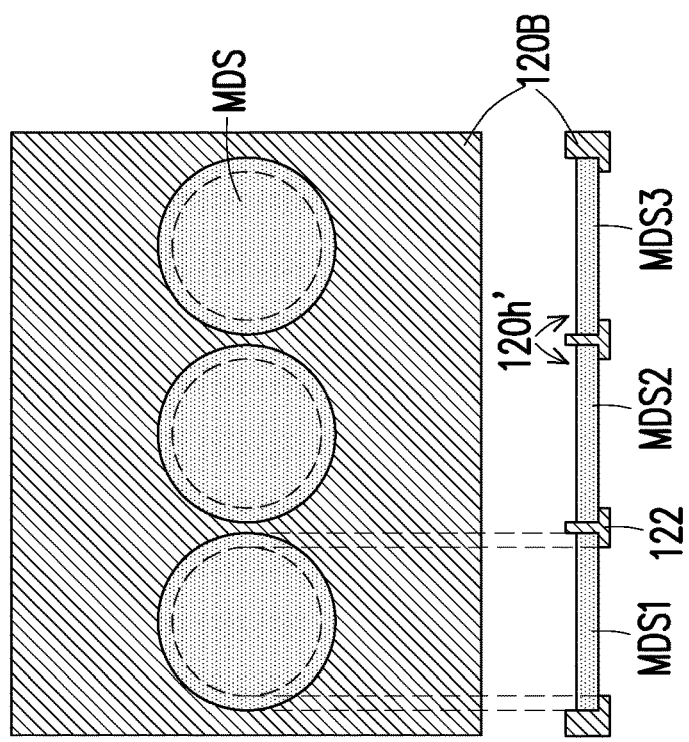

FIG. 1 is a schematic diagram of a mass transfer equipment according to a first embodiment of the invention. FIG. 2 is a block diagram of the mass transfer equipment of FIG. 1. FIG. 3A to FIG. 3D are schematic diagrams of a process of transferring micro devices by using the mass transfer equipment of FIG. 1. FIG. 4A to FIG. 4D are cross-sectional views of the process of transferring micro devices by using the mass transfer device of FIG. 1. FIG. 5 is a schematic diagram of a second substrate stage and a micro device substrate of FIG. 1 under different viewing angles. FIG. 6A and FIG. 6B are schematic diagrams of the second substrate stage and the micro device substrate under different viewing angles according to some other modified embodiments of FIG. 5. For clarity's sake, FIG. 1 omits illustration of a control unit and a connection relationship between other components and the control unit 150 in FIG. 2.

Figure 4B:
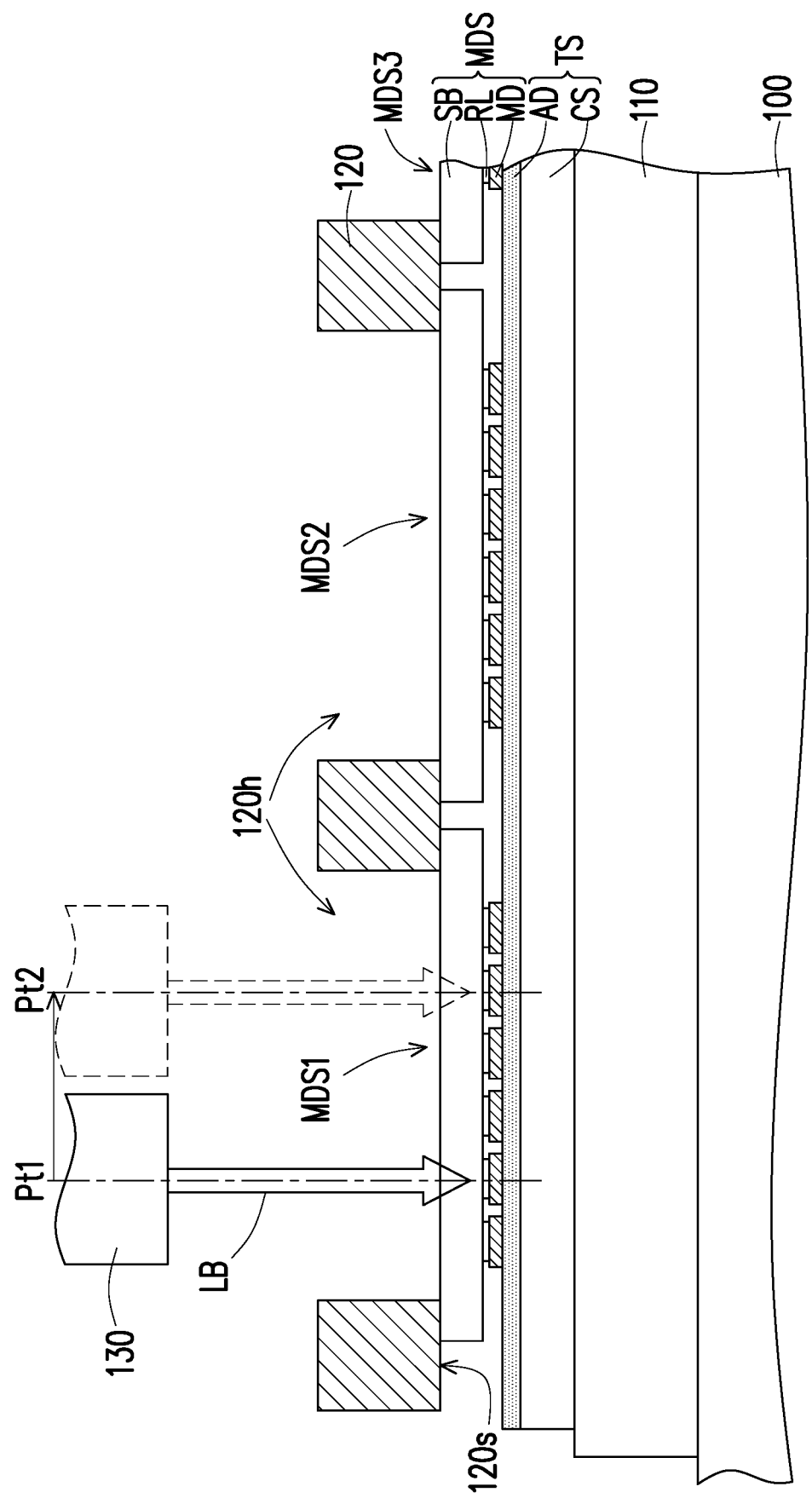

Referring to FIG. 1, FIG. 2 and FIG. 4B, mass transfer equipment 10 includes a base stage 100, a first substrate stage 110, a second substrate stage 120 and a laser head 130. The first substrate stage 110 is used to carry a target substrate TS. The second substrate stage 120 is used to carry micro device substrates MDS. A laser beam LB emitted by the laser head 130 is used to irradiate the corresponding micro device substrate MDS, so that at least one micro device MD to be transferred is separated from a substrate SB and connected to the target substrate TS. To be more specific, the mass transfer equipment 10 adopts a laser lift-off (LLO) technology to realize transferring the micro devices MD.

In the embodiment, the target substrate TS includes, for example, a carrier substrate CS and an adhesive layer AD, but the invention is not limited thereto. In other embodiments, the target substrate TS may also be a circuit backplane of a display panel. On the other hand, the micro device substrate MDS includes the substrate SB and a plurality of micro devices MD disposed on the substrate SB. In the embodiment, the substrate SB of the micro device substrate MDS is, for example, an epitaxial substrate, and the micro device MD is, for example, a micro light-emitting diode (micro LED) fabricated on the epitaxial substrate, but the invention is not limited thereto. In other embodiments, the substrate SB of the micro device substrate MDS may also be a temporary carrier substrate (such as a glass substrate or a flexible substrate) used in the transfer process, and the micro devices MD may also be electronic devices used for executing predetermined electronic functions (such as diodes, transistors, integrated circuits) or photonic functions (LEDs, laser). In order to achieve an effect of laser peeling, a release layer RL is also provided between the micro devices MD and the substrate SB. A viscosity of the release layer RL becomes invalid after being irradiated by the laser beam LB, but the invention is not limited thereto.

In the embodiment, the first substrate stage 110 is movably disposed on the base stage 100 and is adapted to drive the target substrate TS to move or rotate relative to the base platform 100 in at least one direction. In the embodiment, the first substrate stage 110 may perform two-dimensional movement along a movement axis X and a movement axis Y, for example, move along a direction X1 (or a direction X2) and a direction Y1 (or a direction Y2). An axial direction of the movement axis X (for example, the direction X1 or the direction X2) intersects an axial direction of the movement axis Y (for example, the direction Y1 or the direction Y2).

In order to increase flexibility of the manufacturing process, the first substrate stage 110 of the embodiment is further adapted to rotate along rotating axis RX, and an axial direction of the rotating axis RX is perpendicular to the axial direction of the movement axis X and the axial direction of the movement axis Y, but the invention is not limited thereto. In other embodiments, there is no relative rotation between the first substrate stage 110 and the base stage 100.

On the other hand, the second substrate stage 120 is disposed on a side of the first substrate stage 110 away from the base stage 100 and is adapted to drive the micro device substrates MDS to move relative to the first substrate stage 110 in at least one direction. In the embodiment, the second substrate stage 120 may perform three-dimensional movement along the movement axis X, the movement axis Y, and the movement axis Z, for example: to move along the direction X1 (or the direction X2), the direction Y1 (or the direction Y2) and the direction Z1 (or the direction Z2). The axial direction of the movement axis Z (for example, the direction Z1 or the direction Z2), the axial direction of the movement axis X, and the axial direction of the movement axis Y may be selectively perpendicular to each other, but the invention is not limited thereto.

Since the first substrate stage 110 and the second substrate stage 120 may respectively drive the target substrate TS and the micro device substrate MDS to move in different or opposite directions, an alignment speed of a transfer target region on the target substrate TS and the micro device MD to be transferred on the micro device substrate MDS may be increased.

Further, the laser head 130 is arranged on a side of the second substrate stage 120 away from the first substrate stage 110, and is adapted to move to a corresponding target position of the second substrate stage 120 (for example: a target position Pt1 or a target position Pt2). In the embodiment, the laser head 130 may respectively perform two-dimensional movement relative to the second substrate stage 120 along the movement axis X and the movement axis Y, for example: to move along the direction X1 (or the direction X2) and the direction Y1 (or the direction Y2).

In order to ensure the laser beam LB emitted by the laser head 130 to irradiate the corresponding micro device substrate MDS, and make the micro device MD to be transferred to connect the target substrate TS, the second substrate stage 120 has openings 120h disposed in correspondence to the micro device substrates MDS.

For example, in the embodiment, a number of the micro device substrates MDS that may be carried by the second substrate stage 120 is three, which are respectively a first micro device substrate MDS1, a second micro device substrate MDS2, and a third micro device substrate MDS3, and a luminous color of a micro light-emitting device (i.e., the micro device MD) of any of the micro device substrates MDS is different to a luminous color of a micro light-emitting device (i.e., the micro device MD) of another one of the micro device substrates MDS. For example, the luminous colors of the micro light-emitting devices of the first micro device substrate MDS1, the second micro device substrate MDS2, and the third micro device substrate MDS3 are respectively red, green, and blue, but the invention is not limited thereto.

Correspondingly, a number of the openings 120h of the second substrate stage 120 is also three, and the micro device substrates MDS are respectively arranged corresponding to the openings 120h. However, the invention is not limited thereto. In other embodiments, the number of the openings 120h of the second substrate stage 120 and the number of the carried micro device substrates MDS may be adjusted according to actual process requirements. For example, a second substrate stage 120A may be used to carry two first micro device substrates MDS1, two second micro device substrates MDS2, and two third micro device substrates MDS3 (as shown in FIG. 6A).

Referring to FIG. 5 at the same time, in the embodiment, the micro device substrates MDS may be selectively disposed on a surface 120s of the second substrate stage 120 facing the base stage 100, and a width of the micro device substrate MDS in a direction parallel to the surface 120s is slightly larger than a width of the opening 120h of the second substrate stage 120 in the direction. For example, the shortest distance between an orthographic projection profile of the micro device substrate MDS on the surface 120s of the second substrate stage 120 and the opening 120h may be 3 mm, and the micro device substrate MDS is adsorbed to the second substrate stage 120 through an edge portion overlapped to the second substrate stage 120. For example, a plurality of tiny pores arranged on the surface 120s of the second substrate stage 120 and located near the openings 120h and an exhaust channel communicating with these tiny pores are adopted to realize a vacuum adsorption relationship with the micro device substrates MDS, but the invention is not limited thereto.

In other embodiments, a plurality of micro device substrates MDS may also be arranged in opening 120h' of a second substrate stage 120B. The second substrate stage 120B is provided with stop structures 122 on the side where the openings 120h' face the base stage 100, and edge portions of the micro device substrates MDS lean against the stop structures 122 (as shown in FIG. 6B). In the embodiment, a pitch S between any two adjacent micro device substrates MDS in an arrangement direction, or even the size (for example, a circle diameter) may be adjusted according to actual transposition requirements, which is not limited by the invention.

In order to increase alignment accuracy between the target substrate TS, the micro device substrates MDS and the laser head 130, a servo motor module 140 is provided on the movable stages and brackets carrying these components. Namely, the servo motor module 140 may be used to drive the first substrate stage 110, the second substrate stage 120, and the laser head 130 to respectively move along the movement axis X, the movement axis Y, and the movement axis Z.

For example, in the embodiment, the servo motor module 140 may include a servo motor 141A and a servo motor 141B arranged between the first substrate stage 110 and the base stage 100, a plurality of servo motors 142A arranged between the base stage 100 and a plurality of support columns 102, a plurality of servo motors 142B arranged between a plurality of beams 104 and the second substrate stage 120, a plurality of servo motors 142C arranged between the plurality of support columns 102 and the plurality of beams 104, a plurality of servo motors 143B arranged between the plurality of beams 104 and a gantry mechanism 106, and a servo motor 143B arranged between the gantry mechanism 106 and a support arm 108, but the invention is not limited thereto.

In the embodiment, the four support columns 102 and the two beams 104 may form a gantry type mobile platform, and the second substrate stage 120 and the laser head 130 are movably arranged on the gantry type mobile platform. However, the invention is not limited thereto. In other embodiments, a relative movement relationship between the first substrate stage 110, the second substrate stage 120, and the laser head 130 may also be implemented by adopting any movable bracket structure design well known by those skilled in the art.

In detail, the servo motor 141A and the servo motor 141B may drive the first substrate stage 110 to respectively move relative to the base stage 100 along the movement axis X and the movement axis Y. The plurality of servo motors 142A and the plurality of servo motors 142B may drive the second substrate stage 120 to respectively move relative to the base stage 100 and the first substrate stage 110 along the movement axis X and the movement axis Y. The plurality of servo motors 142C may drive the second substrate stage 120 and the laser head 130 to move along the movement axis Z to approach or move away from the base stage 100. The servo motor 143A and the plurality of servo motors 143B may drive the laser head 130 to respectively move relative to the second substrate stage 120 along the movement axis X and the movement axis Y.

Further, the mass transfer equipment 10 may further include a control unit 150. The control unit 150 is, for example, a microcontroller unit (MCU). For example, the control unit 150 is used to receive a setting command from a human-machine interface (not shown), and drive the first substrate stage 110, the second substrate stage 110, the laser head 130 and the servo motor module 140 to operate in a set process flow according to preset process parameters or parameter values that are instantly fed back during the process. Namely, the control unit 150 may integrate the functions of the first substrate stage 110, the second substrate stage 120, the laser head 130, and the servo motor module 140.

Hereinafter, a transfer method of the micro devices MD suitable for the mass transfer equipment 10 will be exemplarily described below. Referring to FIG. 2 and FIG. 3A, after the target substrate TS and the micro device substrates MDS are respectively configured on the first substrate stage 110 and the second substrate stage 120, a transfer process of the micro devices MD is started. The control unit 150 controls the first substrate stage 110 and the second substrate stage 120 to move to predetermined positions on the base stage 100 according to the preset process parameters, so that at least one micro device substrate MDS on the second substrate stage 120 is overlapped with the target substrate TS on the first substrate stage 110 in the axial direction of the movement axis Z. During the process, the first substrate stage 110, for example, moves in the direction X2, and the second substrate stage 120, for example, moves in the direction X1 and the direction Y1, but the invention is not limited thereto.

Particularly, during the movement process of the first substrate stage 110 and the second substrate stage 120, the laser head 130 may synchronously move toward the direction X1 and the direction Y2 to reach the corresponding target position Pt1 of the second substrate stage 120 (as shown in FIG. 4A), so as to shorten a process time required for alignment steps between the first substrate stage 110, the second substrate stage 120 and the laser head 130. It should be understood that a sequence of executing the alignment step of the laser head 130 and the second substrate stage 120 and the alignment step of the first substrate stage 110 and the second substrate stage 120 and whether the alignment steps are synchronously executed may be adjusted according to different process requirements, which is not limited by the invention.

Figure 3B:
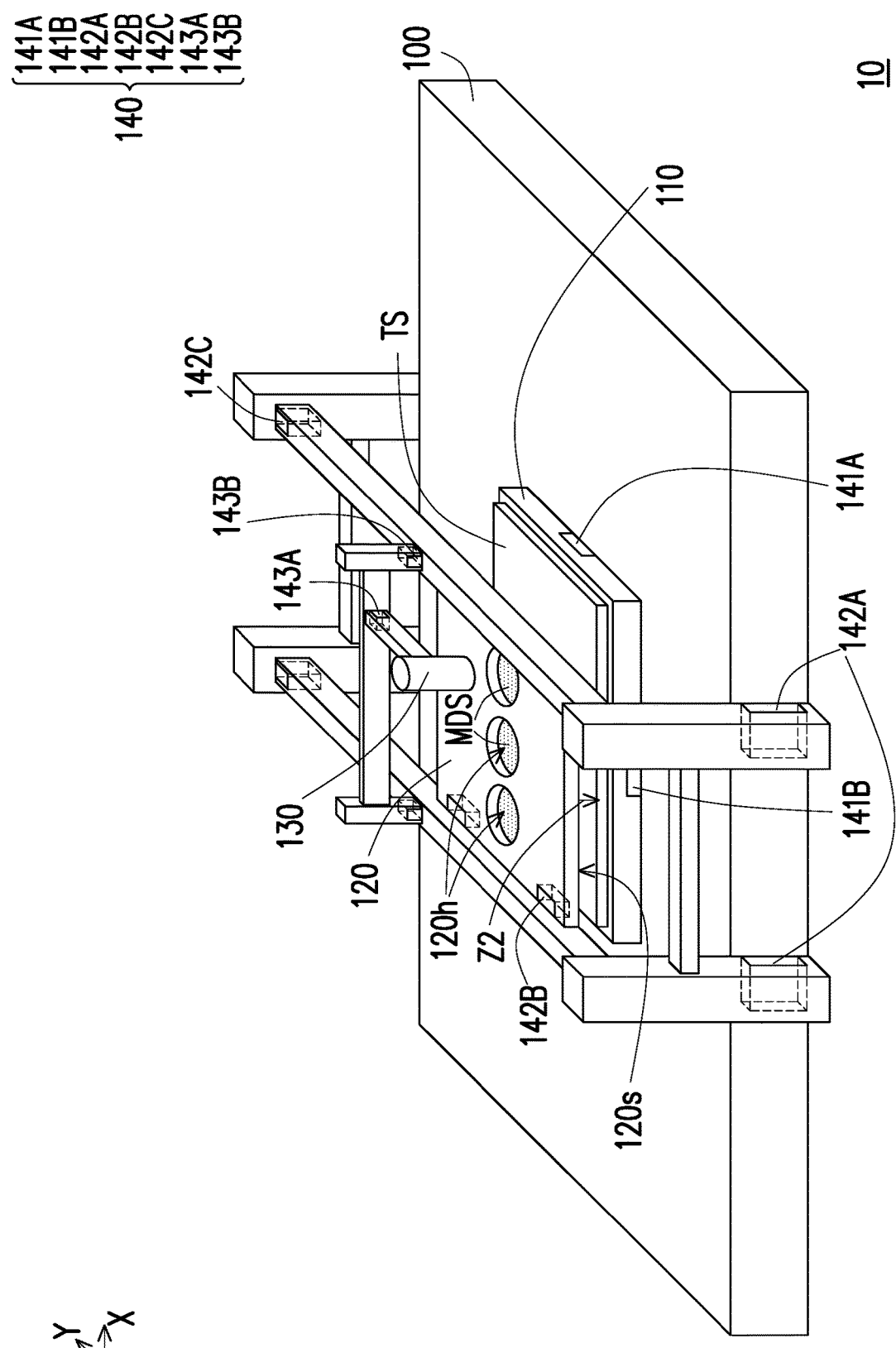
Figure 3C:
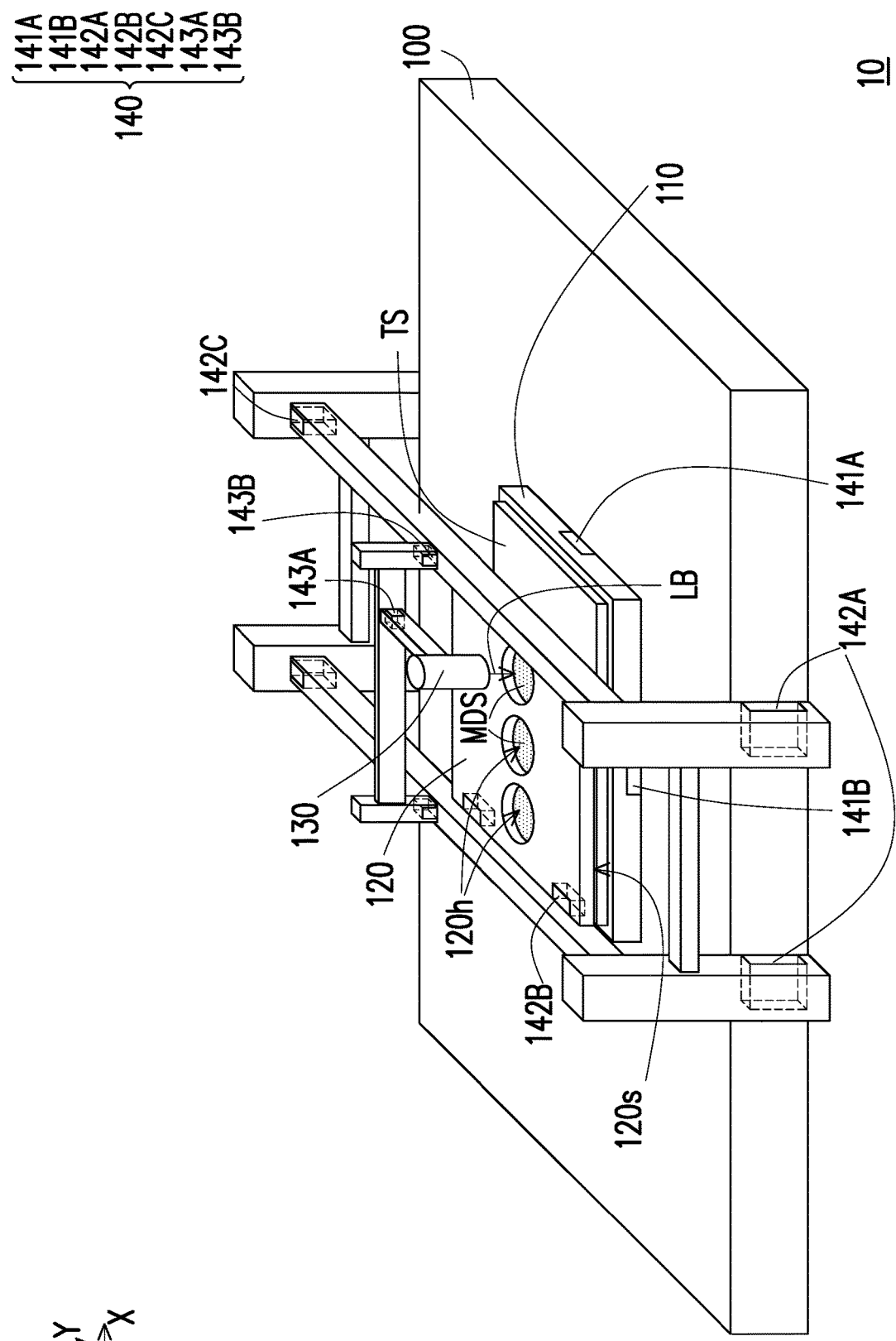

Referring to FIG. 2, FIG. 3B and FIG. 4A, after the control unit 150 receives a feedback signal from the servo motor module 140 and confirms correctness thereof, the control unit 150 controls the second substrate stage 120 and the laser head 130 to move toward the direction of the first substrate stage 110 (for example, the direction Z2), such that the plurality of micro devices MD of the micro device substrate MDS contact the target substrate TS on the first substrate stage 110. As shown in FIG. 3C and FIG. 4B, after the plurality of micro devices MD of the micro device substrate MDS contact the adhesive layer AD of the target substrate TS, the laser head 130 is controlled to emit a laser beam LB. The laser beam LB irradiates the release layer RL between the micro device MD to be transferred and the substrate SB through the opening 120h of the second substrate stage 120, so as to reduce the adhesion between the micro device MD to be transferred and the substrate SB. For example, the release layer RL here may be a laser debonding layer, but the invention is not limited thereto.

Figure 3D:
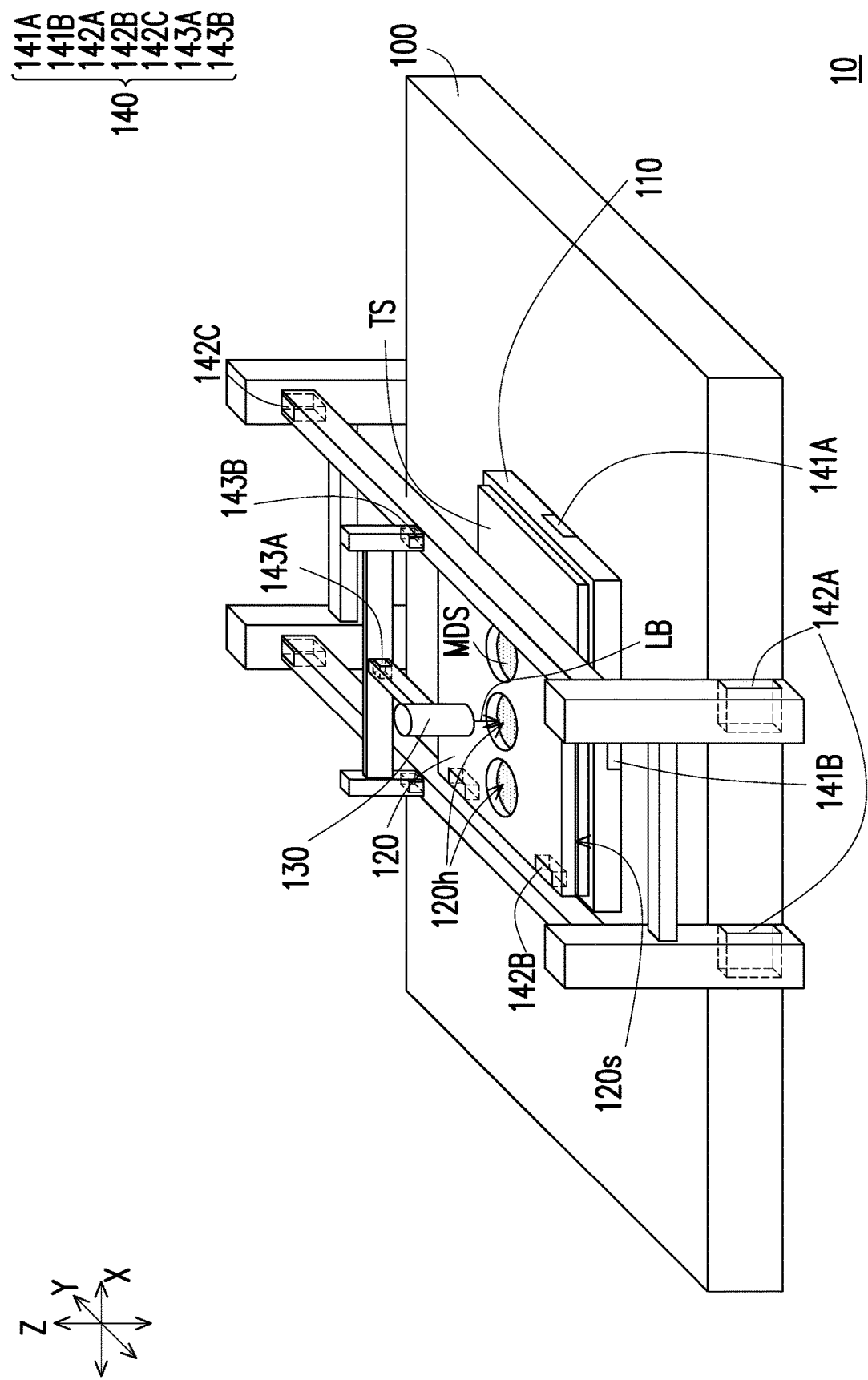
Figure 4C:
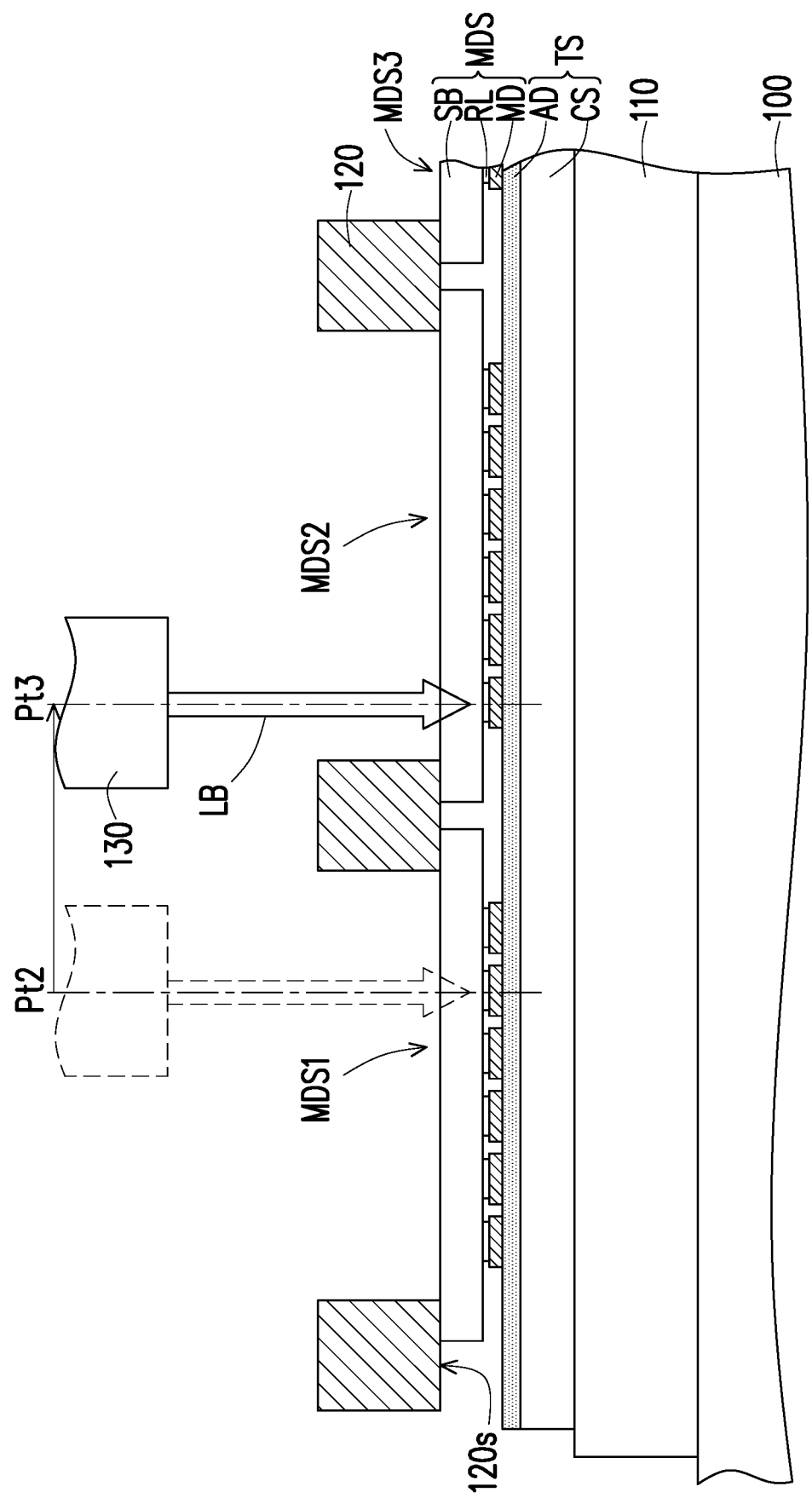

In the embodiment, the mass transfer equipment 10 may be used to transfer a plurality of micro devices MD onto the target substrate TS in a manner of irregular arrangement. For example, after the laser head 130 irradiates a part of the release layer RL at the target position Pt1, the laser head 130 may be further moved to a next target position Pt2 for irradiation, or even moved from the micro device substrate MDS1 (for example, the corresponding target position Pt2 of the second substrate stage 120) to another micro device substrate MDS2 (for example, a corresponding target position Pt3 of the second substrate stage 120) for selective irradiation, as shown in FIG. 3D and FIG. 4C. Namely, the mobility of the laser head 130 increases selection flexibility of the devices to be transferred on the micro device substrate MDS, thereby improving convenience and efficiency of the manufacturing process, and helping to reduce the process time and improve the process yield.

Figure 4D:
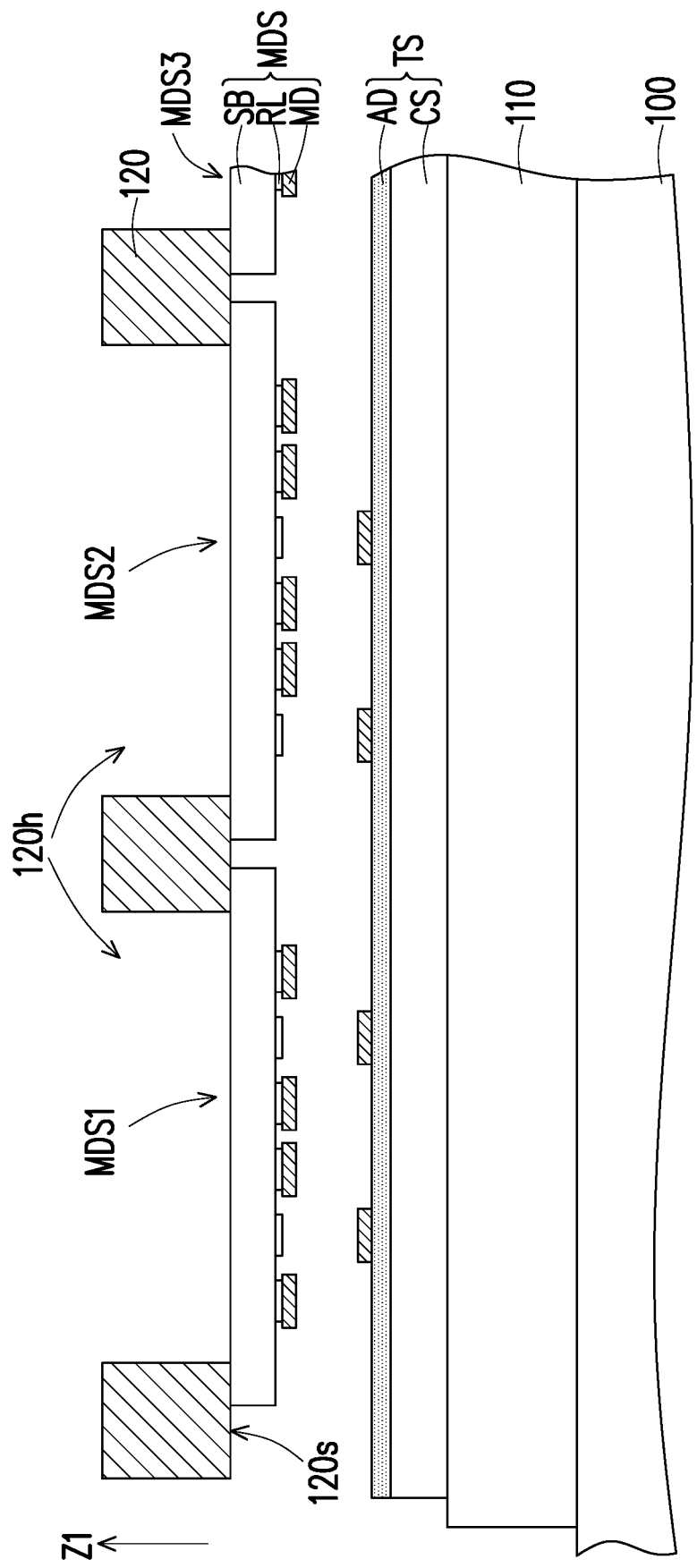

After the irradiation process of the laser beam LB, the second substrate stage 120 is controlled to move in a direction away from the target substrate TS (for example, the direction Z1), so that the plurality of micro devices MD to be transferred are separated from the substrate SB, as shown in FIG. 4D. In this way, the transfer process of a plurality of irregularly arranged micro devices MD is completed. It should be noted that in the embodiment, the number of the micro device MD covered by an irradiation area of each laser beam LB is, for example, one, which does not mean that the invention is limited by the content of the drawings. In other embodiments, the number of the micro devices MD covered by the irradiation area of each laser beam LB may also be plural, and these micro devices MD are adjacent to each other.

Hereinafter, other embodiments are provided below to describe the disclosure in detail, in which the same components are indicated by the same symbols, and the description of the same technical content will be omitted. The aforementioned embodiment may be referred for descriptions of the omitted parts, and detailed descriptions thereof are not repeated in the following embodiment.

Figure 7:
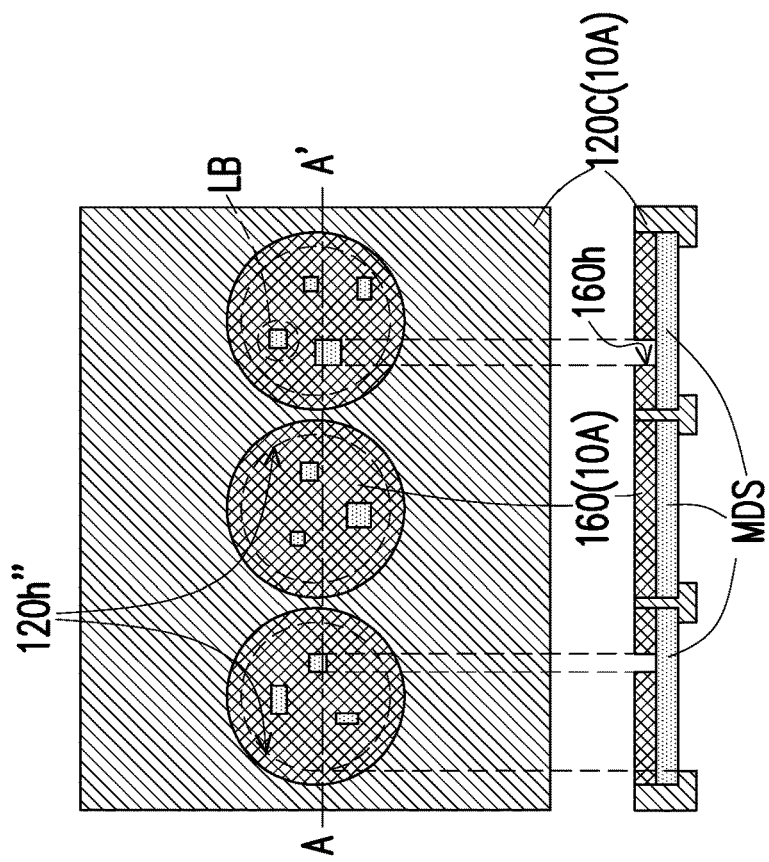
FIG. 7 is a schematic diagram of a second substrate stage, a micro device substrate, and a light shielding layer of mass transfer equipment under different viewing angles according to a second embodiment of the invention.

FIG. 7 is a schematic diagram of a second substrate stage, a micro device substrate, and a light shielding layer of the mass transfer equipment under different viewing angles according to a second embodiment of the invention. In particular, a cross-sectional view diagram at the lower part of FIG. 7 corresponds to a cross-sectional line A-A' in the upper top view diagram.

Referring to FIG. 7, a main difference between mass transfer equipment 10A of the embodiment and the mass transfer equipment 10 of FIG. 1 is that the mass transfer equipment 10A further includes a light shielding layer 160 arranged in overlap with the micro device substrate MDS. Since a configuration of a second substrate stage 120C of the embodiment is similar to that of the second substrate stage 120B of FIG. 6B, and other components are similar to that of the mass transfer equipment 10 of FIG. 1, detailed descriptions thereof may be deduced by referring to descriptions of the related paragraphs of the aforementioned embodiment, which are not repeated.

To be specific, the light shielding layer 160 is further provided in openings 120h" of the second substrate stage 120C, and the light shielding layer 160 is located on the side of the micro device substrate MDS facing the laser head. In particular, the light shielding layer 160 has at least one opening 160h overlapped with the micro device substrate MDS, and the laser beam LB may irradiate the micro device substrate MDS through a light-transmitting area defined by the opening 160h. In the embodiment, each light shielding layer 160 may have a plurality of openings 160h, and orthographic projection areas and contours of these openings 160h on the micro device substrate MDS are different. However, the invention is not limited thereto. In other embodiments, the arrangement, sizes and contours of the openings 160h of the light shielding layer 160 may be adjusted according to actual transfer process requirements.

By configuring the light shielding layer 160, the selection flexibility and transfer yield of the micro device with a smaller size may be further increased. For example, when the size of the micro device is significantly smaller than the irradiation area of the laser beam LB, it will be difficult to select a single or a small amount of the micro devices. Therefore, the openings 160h of the light shielding layer 160 may allow only a part of the laser beam LB to pass through and irradiate the areas to be selected on the micro device substrate MDS. Accordingly, the transfer process between the target substrate and the micro device substrate with densely arranged and small-size micro devices is implemented.

Figure 8:
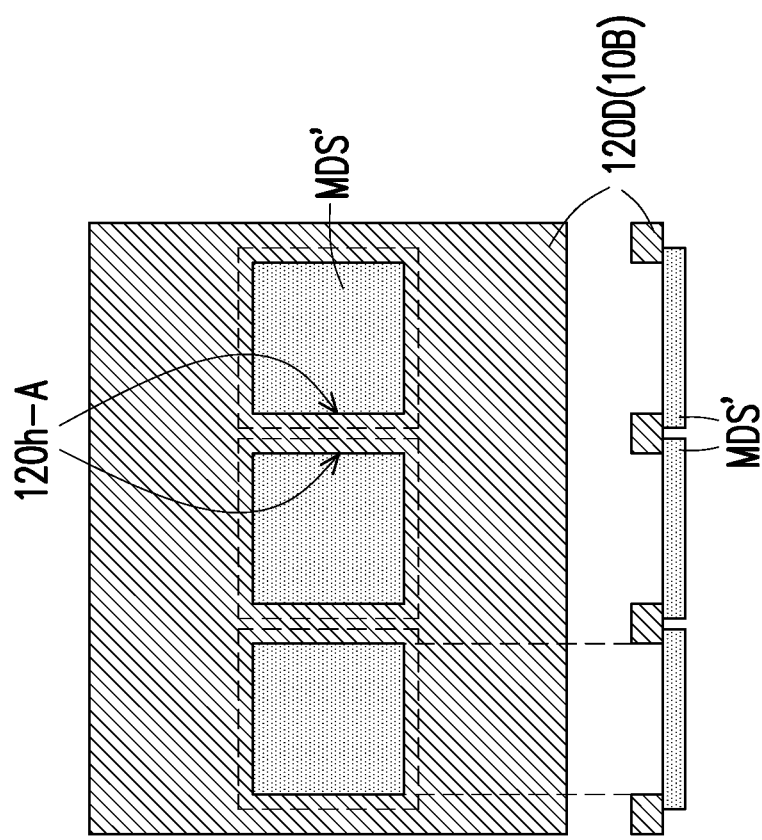
FIG. 8 is a schematic diagram of a second substrate stage and a micro device substrate of mass transfer equipment under different viewing angles according to a third embodiment of the invention.
Figure 9:
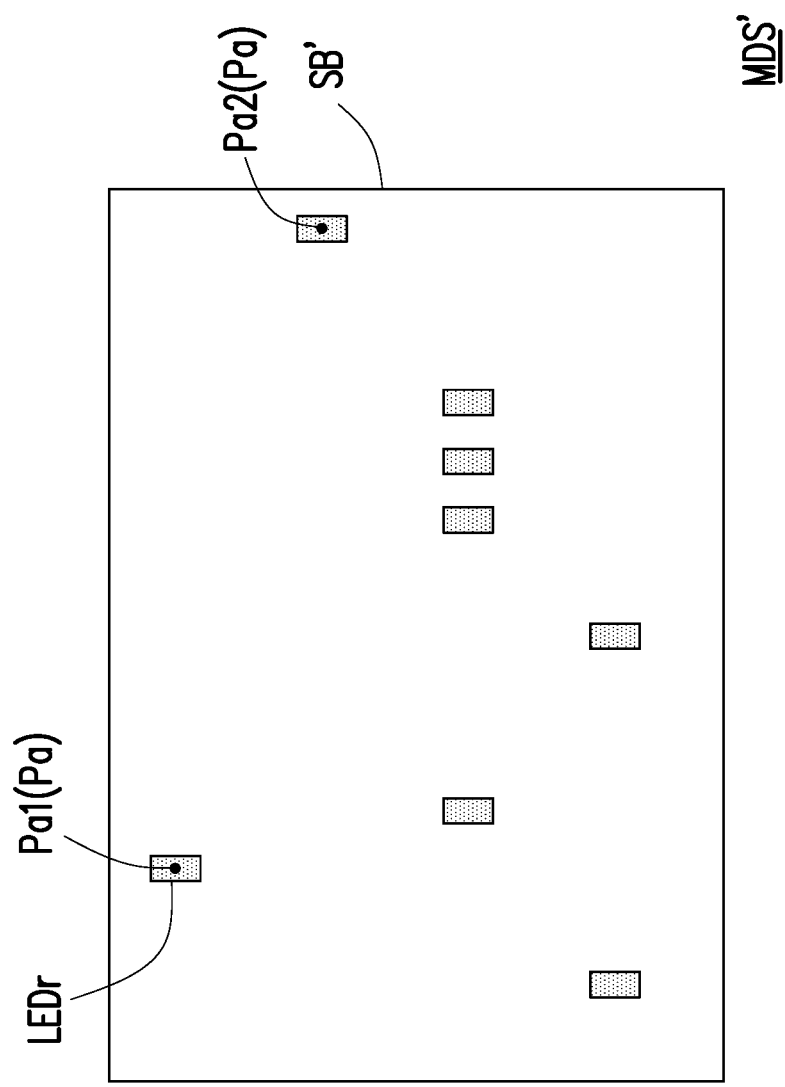
FIG. 9 is an enlarged perspective view of the micro device substrate of FIG. 8.
Figure 10:
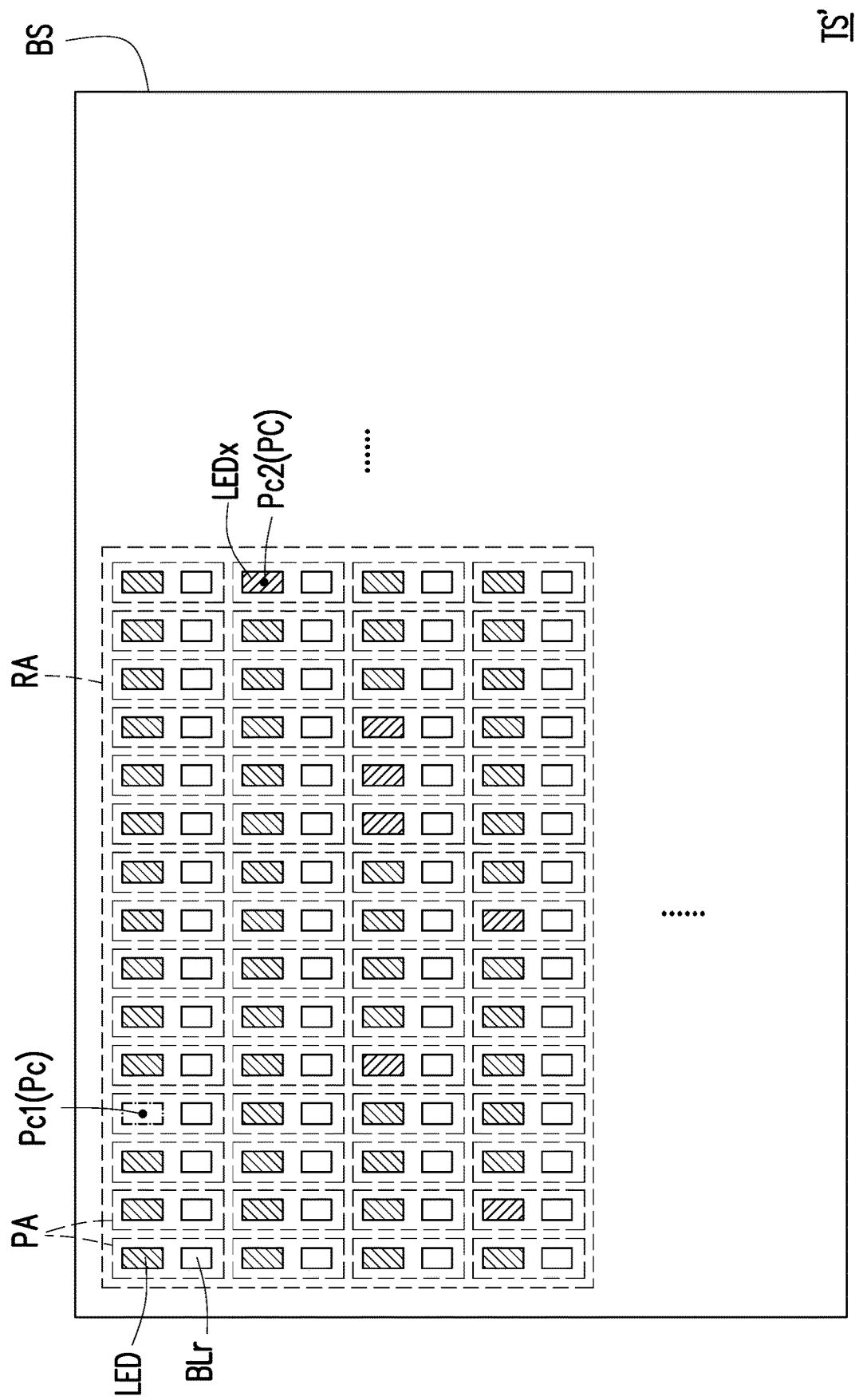
FIG. 10 is a schematic top view of a target substrate that uses the micro device substrate of FIG. 9 for transferring.
Figure 11A:
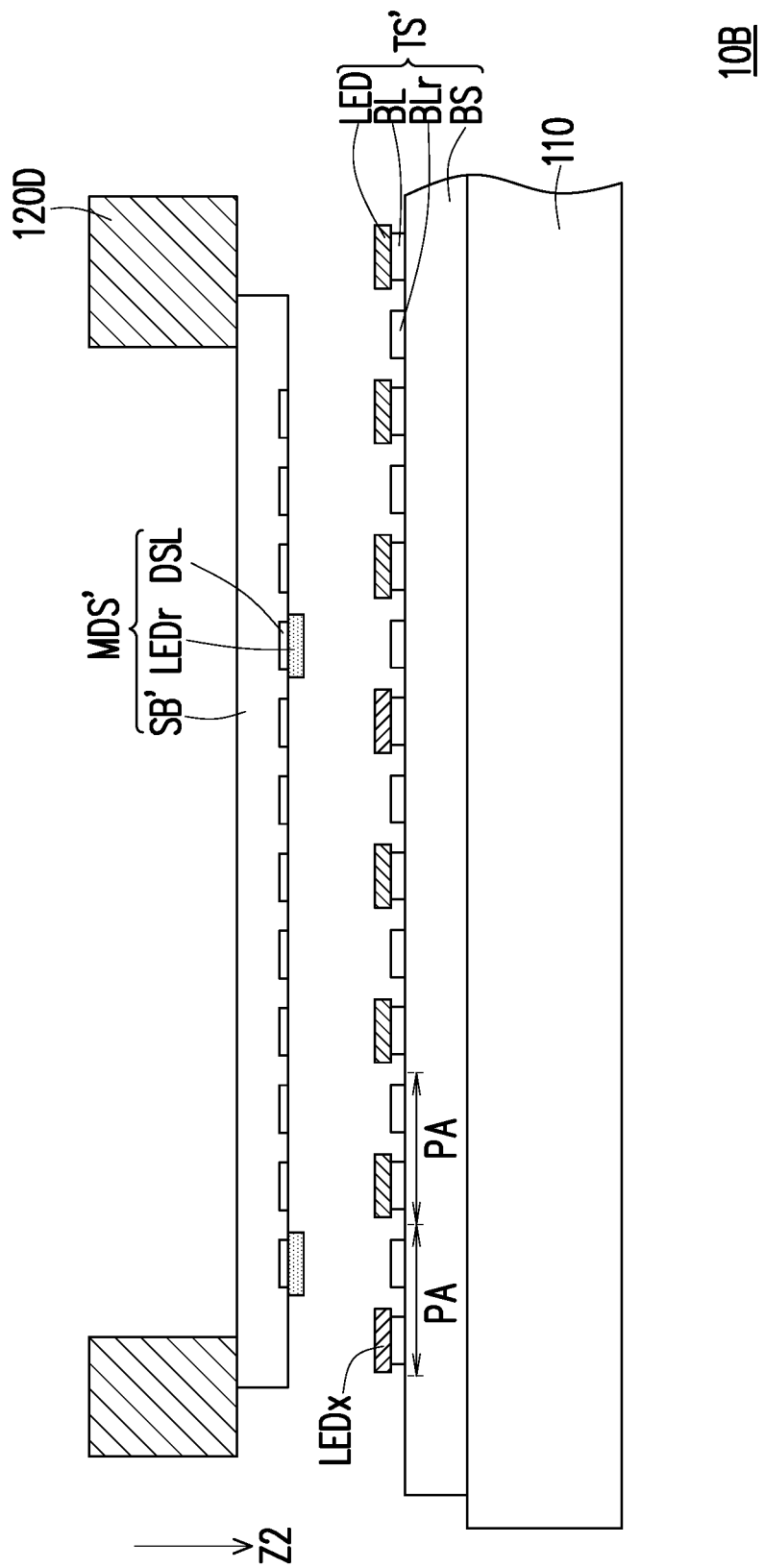
FIG. 11A to 11C are cross-sectional views of a process of transferring micro devices by the mass transfer equipment according to the third embodiment of the invention.
Figure 11B:
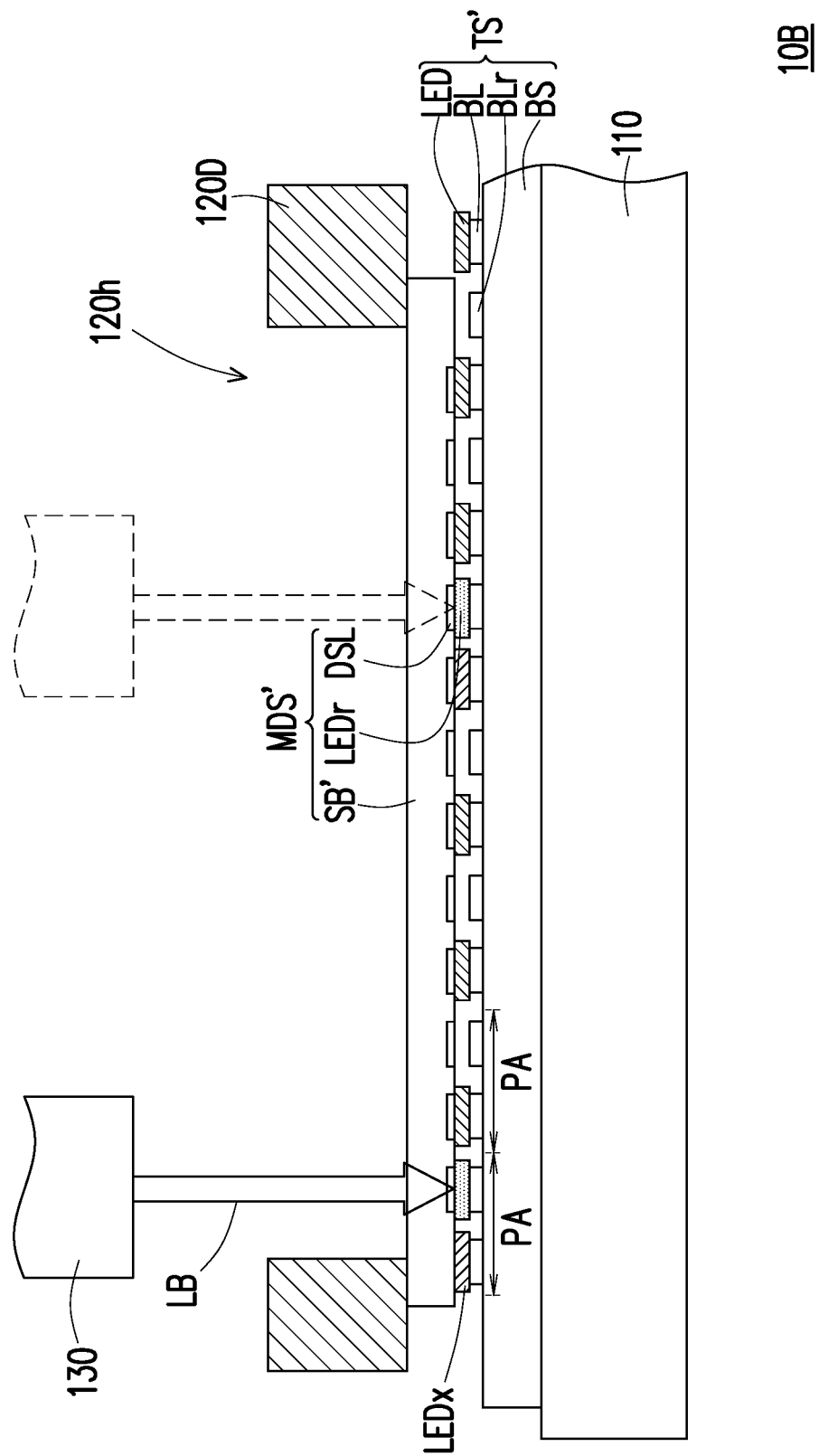
Figure 11C:
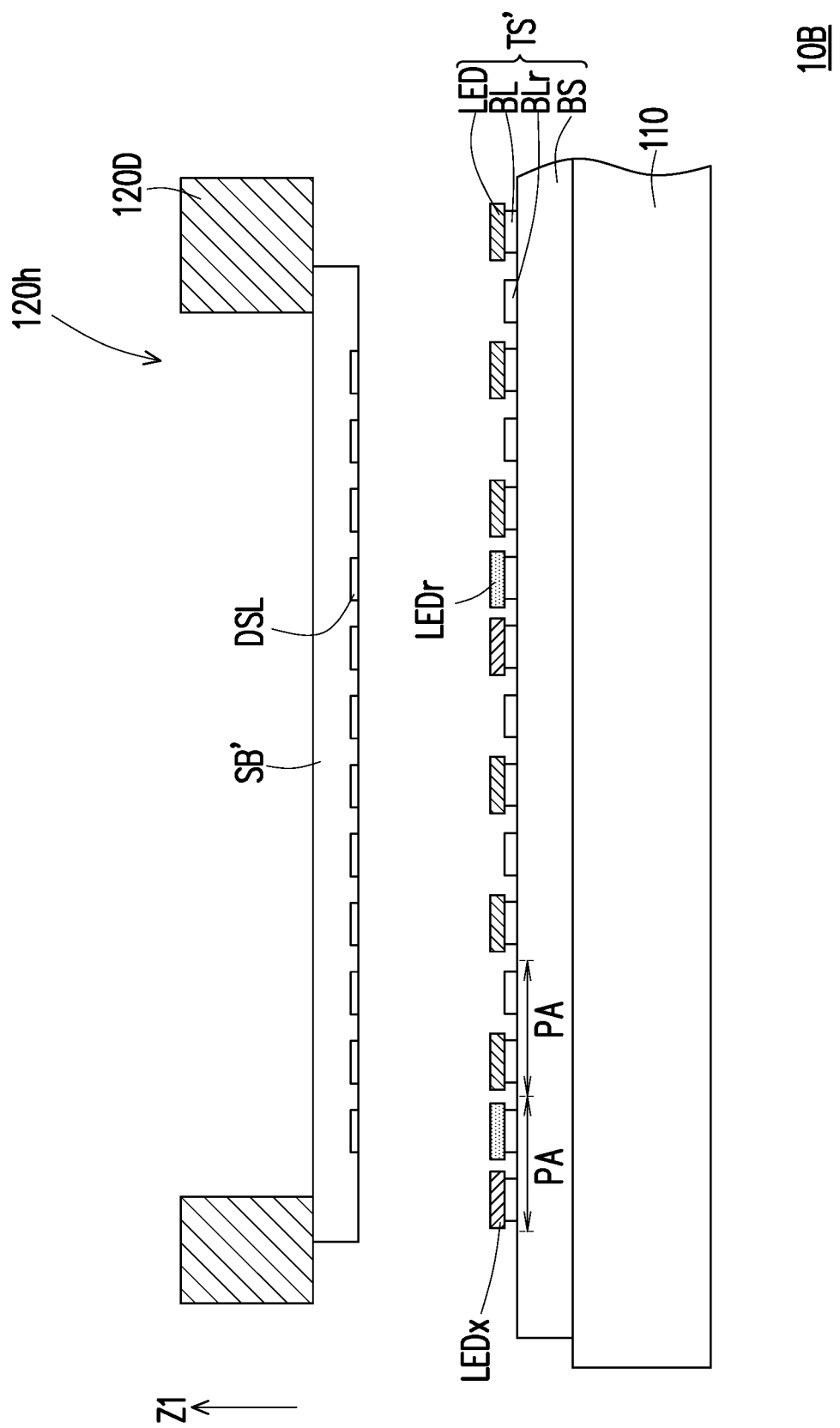
Figure 12:
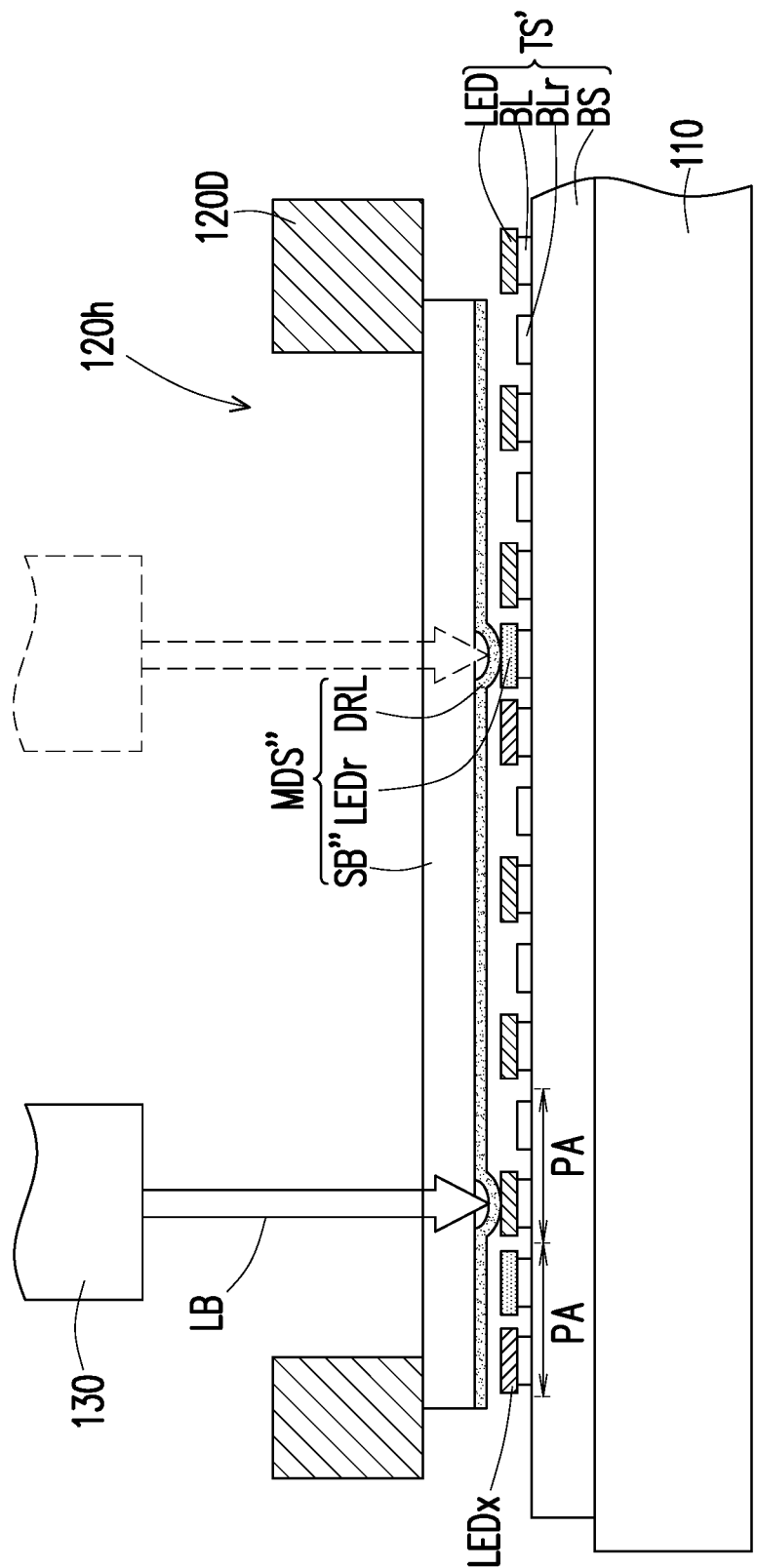
FIG. 12 is a schematic cross-sectional view of another modified embodiment of the micro device substrate of FIG. 11B.

FIG. 8 is a schematic diagram of a second substrate stage and a micro device substrate of mass transfer equipment under different viewing angles according to a third embodiment of the invention. FIG. 9 is an enlarged perspective view of the micro device substrate of FIG. 8. FIG. 10 is a schematic top view of a target substrate that uses the micro device substrate of FIG. 9 for transferring. FIG. 11A to 11C are cross-sectional views of a process of transferring micro devices by the mass transfer equipment according to the third embodiment of the invention. FIG. 12 is a schematic cross-sectional view of another modified embodiment of the micro device substrate of FIG. 11B.

Referring to FIG. 8, FIG. 9 and FIG. 10, a difference between mass transfer equipment 10B of the embodiment and the mass transfer equipment 10 of FIG. 1 is that a contour of an opening of a second substrate stage is different. To be specific, a contour of an opening 120h-A of a second substrate stage 120D of the mass transfer equipment 10B is rectangular. Correspondingly, a contour of a micro device substrate MDS' carried by the second substrate stage 120D is also rectangular. Since the mass transfer equipment 10B of the embodiment is similar to the mass transfer equipment 10 of FIG. 1, detailed descriptions of the components other than the second substrate stage 120D may be deduced by referring to the descriptions of the related paragraphs of the aforementioned embodiment, which are not repeated.

In the embodiment, a target substrate TS' is, for example, a micro light-emitting diode display panel. For example, the target substrate TS' has a plurality of pixel areas PA, and includes a circuit backplane BS, a plurality of micro light-emitting devices LED, a plurality of bonding layers BL, and a plurality of reserved bonding layers BLr. The micro light-emitting devices LED are respectively arranged in the pixel areas PA, and are respectively electrically connected to the circuit backplane BS via the bonding layers BL. It should be noted that each pixel area PA is also provided with at least one reserved bonding layer BLr, and the reserved bonding layers BLr and the micro light-emitting devices LED are arranged at intervals.

When a part of the micro light-emitting devices LED on the target substrate TS' is detected to have poor light emission (for example, abnormal micro light-emitting devices LEDx) or is missing, the mass transfer equipment 10B of the embodiment may be used to perform a repair process. In the embodiment, the target substrate TS' may be divided into a plurality of repair areas RA, and each of the abnormal micro light-emitting devices LEDx or missing micro light-emitting devices LED has a position coordinate Pc relative to the repair area RA. For example, the target substrate TS' loses a micro light-emitting device LED at a position coordinate Pc1 of the repair area RA, and has an abnormal micro light-emitting device LEDx with poor light emission at a position coordinate Pc2 of the repair area RA.

In the embodiment, the micro devices on the micro device substrate MDS' are, for example, repairing micro light-emitting devices LEDr. Since these abnormal or missing micro light-emitting devices are arranged irregularly on the circuit backplane BS, the repairing micro light-emitting devices LEDr need to be arranged at corresponding arrangement positions Pa on the substrate SB' of the micro device substrate MDS' according to the position coordinates Pc of theses abnormal or missing micro light-emitting devices on the repair area RA of the target substrate TS'. For example, the micro device substrate MDS' is provided with the repairing micro light-emitting devices LEDr at both of an arrangement position Pa1 and an arrangement position Pa2 to respectively repair the missing micro light-emitting device LED at the position coordinate Pc1 of the target substrate TS' and the abnormal light-emitting device LEDx at the position coordinate Pc2.

It should be noted that since the repairing micro light-emitting devices LEDr on the micro element substrate MDS' of the embodiment are arranged on the substrate SB' in an irregular manner, the mass transfer equipment 10 as shown in FIG. 1 may be used to transfer a part of the micro light-emitting diodes (i.e. the micro devices MD of FIG. 4A) fabricated on the epitaxial substrate (i.e. the substrate SB of FIG. 4A) to the substrate SB' of the embodiment to form a repairing micro device substrate MDS', but the invention is not limited thereto.

Hereinafter, a transfer method of the repairing micro light-emitting devices LEDr adapted to the mass transfer equipment 10B is described below. Since the alignment steps of the first substrate stage 110, the second substrate stage 120D, and the laser head 130 of the embodiment are similar to the alignment steps of the mass transfer equipment 10B of FIG. 3A and FIG. 3B, detailed descriptions thereof may be deduced by referring to the descriptions of the related paragraphs of the aforementioned embodiment, which are not repeated.

Referring to FIG. 11A, in the embodiment, in order to repair the abnormal micro light-emitting devices LEDx on the target substrate TS', the alignment step of the first substrate stage 110 and the second substrate stage 120D is carried on based on positions of the reserved bonding layers BLr in the pixel area PA to be repaired. Namely, after the alignment of the first substrate stage 110 and the second substrate stage 120 is completed, the repairing micro light-emitting devices LEDr on the micro device substrate MDS' are overlapped with the reserved bonding layers BLr of the pixel area PA to be repaired on the target substrate TS' in the axial direction of the movement axis Z (for example, the direction Z2).

Then, the second substrate stage 120D is controlled to move toward a direction of the first substrate stage 110 (for example, the direction Z2), so that the plurality of repairing micro light-emitting devices LEDr of the micro device substrate MDS' contact the plurality of reserved bonding layers BLr on the target substrate TS', as shown in FIG. 11A and FIG. 11B. Particularly, in the embodiment, the connection relationship between the plurality of repairing micro light-emitting devices LEDr of the micro device substrate MDS' and the substrate SB' is realized by laser dissociation layers DSL, and the laser dissociation layers DSL may be vaporized and dissociated after being irradiated by the laser beam LB.

After the repairing micro light-emitting devices LEDr of the micro device substrate MDS' contact the reserved bonding layers BLr of the target substrate TS', the laser head 130 is controlled to emit the laser beam LB. The laser beam LB irradiates the laser dissociation layers DSL connected between the repairing micro light-emitting devices LEDr to be transferred and the substrate SB' through the opening 120h of the second substrate stage 120D, so as to release the connection relationship between the repairing micro light-emitting devices LEDr to be transferred and the substrate SB'. After the irradiation of the laser beam LB, the second substrate stage 120D is moved in a direction away from the target substrate TS' (for example, the direction Z1), so that the plurality of repairing micro light-emitting devices LEDr to be transferred are separated from the substrate SB' and connected to the corresponding plurality of reserved bonding layers BLr, as shown in FIG. 11C. In this way, the transfer process of a plurality of irregularly arranged repairing micro light-emitting devices LEDr is completed.

It should be noted that in other embodiments, the laser dissociation layer DSL of the micro component substrate MDS' may also be replaced by a dynamic release layer DRL to form a micro device substrate MDS" shown in FIG. 12. When the dynamic release layer DRL is irradiated by the laser beam LB, vapor is generated at a junction of the dynamic release layer DRL and the substrate SB" to deform the dynamic release layer DRL. Such deformation may reduce a connection area between the repairing micro light-emitting device LEDr and the dynamic release layer DRL, so that the repairing micro light-emitting device LEDr may detach from the substrate SB due to an insufficient adhesion force during a process that the micro device substrate MDS" is away from the target substrate TS'.

Figure 13:
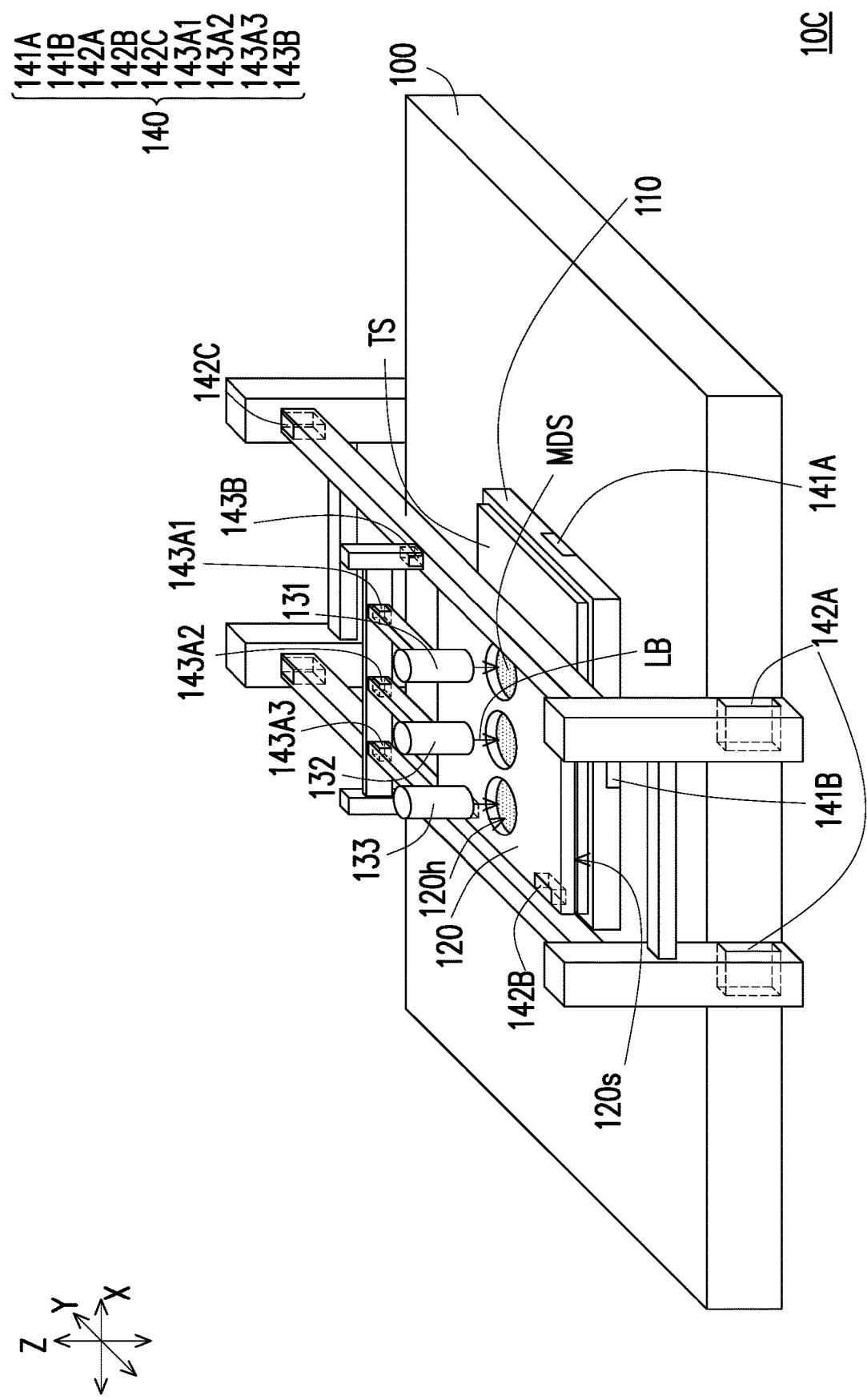
FIG. 13 is a schematic diagram of a mass transfer equipment of a fourth embodiment of the invention.
Figure 14:
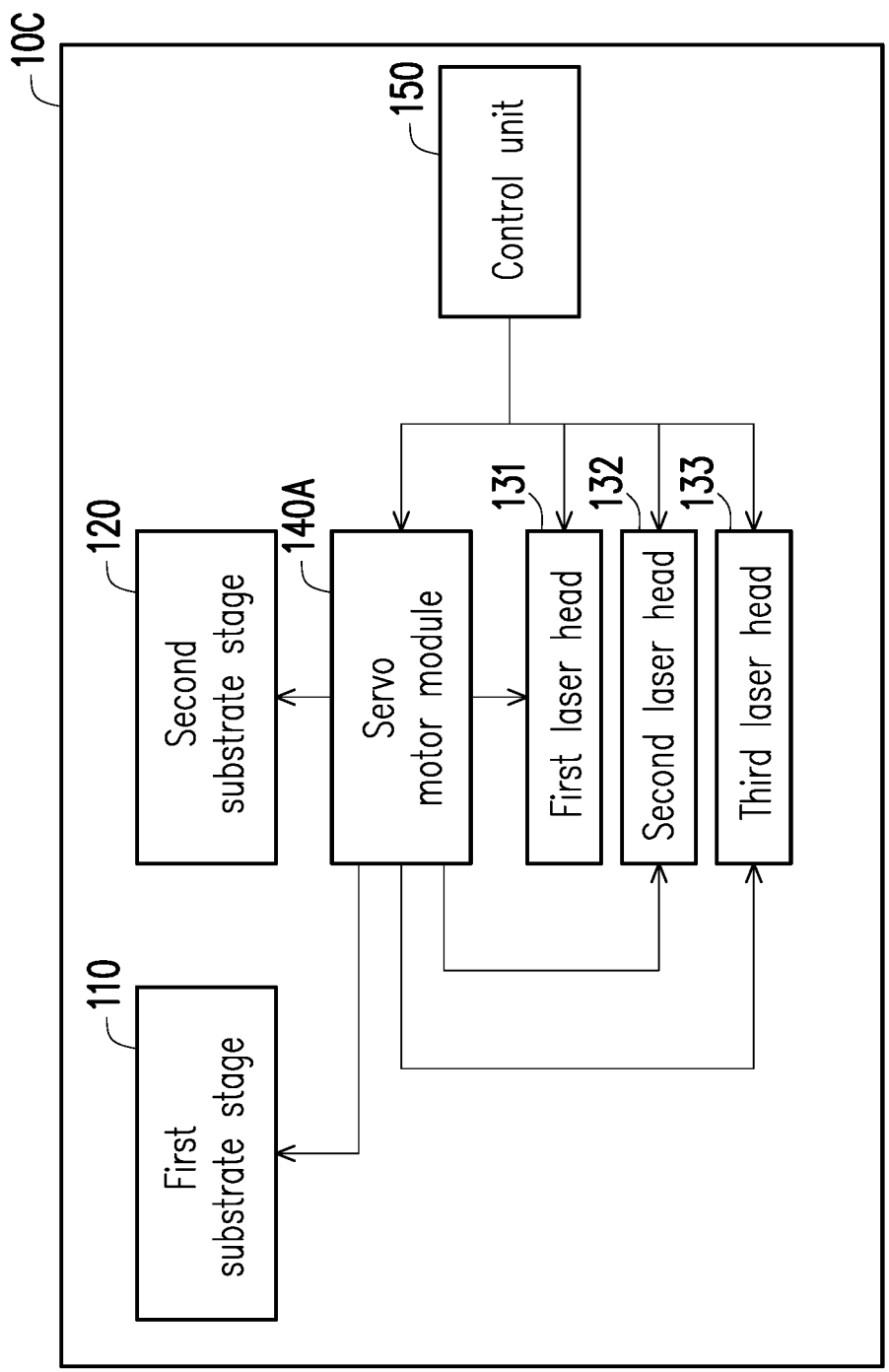
FIG. 14 is a block diagram of the mass transfer equipment of FIG. 13.

FIG. 13 is a schematic diagram of a mass transfer equipment of a fourth embodiment of the invention. FIG. 14 is a block diagram of the mass transfer equipment of FIG. 13. For clarity's sake, FIG. 13 omits the drawing of the control unit 150 and the connection relationship between other components and the control unit 150 in FIG. 14.

Referring to FIG. 13 and FIG. 14, a difference between mass transfer equipment 10C of the embodiment and the mass transfer equipment 10 of FIG. 1 is that the number of the laser heads is different. In order to further increase the flexibility of the transfer process, the number of the laser heads of the mass transfer equipment 10C is increased to three, which are respectively a laser head 131, a laser head 132, and a laser head 133. Correspondingly, these laser heads are respectively arranged on three support arms 108, and the support arms 108 are respectively movably installed on the beam of the gantry mechanism 106 through a servo motor 143A1, a servo motor 143A2, and a servo motor 143A3. Namely, the control unit 150 may individually control the movement of the laser heads 131, 132, and 133 on the movement axis X through the servo motors 143A1, 143A2, and 143A3.

For example, the three laser heads may be respectively set corresponding to the three micro device substrates MDS, and during the transfer process, the three laser heads may simultaneously irradiate the three micro device substrates MDS to further reduce the process time, but the invention is not limited thereto. In other embodiments, the number of the laser heads used in the transfer process and the operation mode may be adjusted according to different process requirements. For example, two laser heads may be used to irradiate the same micro device substrate MDS at the same time. In other words, the arrangement of multiple laser heads may further increase the process flexibility.

Since the operations of the first substrate stage 110, the second substrate stage 120, the laser heads, the servo motor module 140A, and the control unit 150 of the mass transfer equipment 10C are similar to that of the mass transfer equipment 10 of FIG. 1, detailed descriptions thereof may be deduced by referring to descriptions of the related paragraphs of the aforementioned embodiment, which are not repeated.

In summary, in the mass transfer equipment of the embodiment of the invention, the first substrate stage and the second substrate stage respectively drive the target substrate and the micro device substrate to move in different directions, which may increase an alignment speed of transfer target regions on the target substrate and the micro devices to be transferred on the micro device substrate. Regarding a transfer process or repairing process where distribution of the transfer target regions is relatively irregular, mobility of the laser head increases selection flexibility of the micro devices to be transferred on the micro device substrate, which helps to reduce a process time and improve a process yield. In addition, configuration of the servo motor module may further increase alignment accuracy between the target substrate, the micro device substrate and the laser head.

What is claimed is:

1. A mass transfer equipment, comprising:
a base stage;
a first substrate stage, disposed on the base stage, and adapted to drive a target substrate to move relative to the base stage along a first direction;
a second substrate stage, disposed on the base stage, and adapted to drive at least one micro device substrate to move relative to the first substrate stage along a second direction, wherein the first direction intersects the second direction, the at least one micro device substrate has a substrate and at least one micro device, and the at least one micro device is disposed on a surface of the substrate facing the target substrate;
at least one laser head, adapted to move to a corresponding target position of the second substrate stage and emitting a laser beam toward the at least one micro device substrate, wherein the laser beam is used to irradiate the at least one micro device substrate, so that the at least one micro device is separated from the substrate and connected with the target substrate; and
a servo motor module, driving the first substrate stage, the second substrate stage and the at least one laser head to move.

2. The mass transfer equipment as claimed in claim 1, wherein the first substrate stage is further adapted to drive the target substrate to move relative to the base stage along the second direction, the second substrate stage is further adapted to drive the at least one micro device substrate to move relative to the first substrate stage along the first direction and a third direction, and the third direction intersects the first direction and the second direction.

3. The mass transfer equipment as claimed in claim 2, wherein the second substrate stage moves along the third direction, so that the at least one micro device of the at least one micro device substrate contacts the target substrate.

4. The mass transfer equipment as claimed in claim 1, wherein the first substrate stage is further adapted to rotate along a rotating axis, and an axial direction of the rotating axis is perpendicular to the first direction and the second direction.

5. The mass transfer equipment as claimed in claim 1, wherein the second substrate stage has at least one opening, the at least one micro device substrate is disposed corresponding to the at least one opening, and the laser beam is adapted to irradiate the at least one micro device substrate through the at least one opening.

6. The mass transfer equipment as claimed in claim 5, further comprising:
at least one light shielding layer, disposed in overlap with the at least one micro device substrate, and having at least one light-transmitting area overlapped with the at least one micro device, wherein at least a part of the laser beam further irradiates the at least one micro device substrate through the at least one light-transmitting area.

7. The mass transfer equipment as claimed in claim 1, wherein the at least one micro device substrate is a plurality of micro device substrates, the at least one laser head is a plurality of laser heads, and the laser heads are respectively disposed corresponding to the micro device substrates.

8. The mass transfer equipment as claimed in claim 7, wherein the micro device substrates respectively have an epitaxial substrate, the at least one micro device is a plurality of micro light-emitting devices respectively formed on each of the epitaxial substrates, and a luminous color of the micro light-emitting devices of any one of the micro device substrates is different from a luminous color of the micro light-emitting devices of another one of the micro device substrates.

9. The mass transfer equipment as claimed in claim 1, wherein the target substrate has a plurality of pixel areas, and comprises:
a circuit backplane; and
at least one reserved bonding layer, arranged in one of the pixel areas,
wherein the at least one micro device of the at least one micro device substrate is a repairing micro light-emitting device, and the repairing micro light-emitting device is arranged in a corresponding arrangement position on the substrate of the at least one micro device substrate according to a position coordinate on the target substrate.

10. The mass transfer equipment as claimed in claim 9, wherein the laser head is moved to the corresponding target position of the second substrate stage according to the arrangement position, and emits the laser beam toward a part of the at least one micro device substrate at the arrangement position, so that the repairing micro light-emitting device is connected with the at least one reserved bonding layer in one of the pixel areas, and is separated from the substrate of the at least one micro device substrate.

11. The mass transfer equipment as claimed in claim 1, wherein the at least one micro device substrate further has a release layer connected between the micro devices and the substrate, and a viscosity of the release layer becomes invalid after being irradiated by the laser beam.

12. The mass transfer equipment as claimed in claim 11, wherein the release layer is a laser debonding layer or a laser dissociation layer.

13. The mass transfer equipment as claimed in claim 1, wherein the at least one micro device substrate further has a dynamic release layer connecting the at least one micro device and the substrate, after the laser beam irradiates the at least one micro device substrate, the dynamic release layer is deformed to separate the at least one micro device.

14. The mass transfer equipment as claimed in claim 1, wherein the target substrate is a combination of a carrier substrate and an adhesive layer, and the at least one micro device is adhered to the carrier substrate through the adhesive layer.

* * * * *